US012696439B2

(12) United States Patent
Lee et al.

(10) Patent No.: US 12,696,439 B2
(45) Date of Patent: Jul. 28, 2026

(54) SEMICONDUCTOR DEVICE INCLUDING AN INSULATING STRUCTURE ON A SIDEWALL OF A LANDING PAD

(71) Applicant: SAMSUNG ELECTRONICS CO., LTD., Suwon-si (KR)

(72) Inventors: Hongjun Lee, Suwon-si (KR); Kyungsun Ryu, Hwaseong-si (KR); Dongjun Lee, Anyang-si (KR); Jin-Seong Lee, Gapyeong-gun (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 987 days.

(21) Appl. No.: 17/558,728

(22) Filed: Dec. 22, 2021

(65) Prior Publication Data

US 2022/0352173 A1     Nov. 3, 2022

(30) Foreign Application Priority Data

Apr. 28, 2021     (KR) ........................ 10-2021-0055093

(51) Int. Cl.
*H10B 12/00*          (2023.01)
(52) U.S. Cl.
CPC ........... *H10B 12/315* (2023.02); *H10B 12/50* (2023.02)
(58) Field of Classification Search
CPC .............................. H10B 12/315; H10B 12/50
See application file for complete search history.

(56) References Cited

U.S. PATENT DOCUMENTS

| | | | | |
|---|---|---|---|---|
| 5,969,393 | A | * 10/1999 | Noguchi | ........... H01L 29/66772 |
| | | | | 257/E21.546 |
| 8,058,678 | B2 | 11/2011 | Kim et al. | |
| 9,589,898 | B2 | 3/2017 | Chun | |
| 9,608,077 | B1 | 3/2017 | Kye et al. | |
| 2012/0261747 | A1 | 10/2012 | Park et al. | |
| 2014/0327063 | A1* | 11/2014 | Park | ................... H10B 12/0335 |
| | | | | 257/296 |
| 2015/0380508 | A1* | 12/2015 | Kim | ..................... H10B 12/482 |
| | | | | 257/773 |
| 2017/0062347 | A1* | 3/2017 | Kim | ..................... H01L 23/4821 |
| 2018/0158826 | A1* | 6/2018 | Cho | ....................... H10B 12/30 |
| 2019/0067294 | A1* | 2/2019 | Lee | ....................... H10B 12/315 |
| 2019/0164975 | A1* | 5/2019 | Song | .................. H01L 29/0649 |
| 2019/0355728 | A1 | 11/2019 | Kim et al. | |
| 2020/0152634 | A1 | 5/2020 | Lee et al. | |
| 2020/0161307 | A1 | 5/2020 | Jang et al. | |

(Continued)

FOREIGN PATENT DOCUMENTS

| | | | |
|---|---|---|---|
| KR | 10-2001-0060038 A | 7/2001 | |
| KR | 10-2012-0061552 A | 6/2012 | |

(Continued)

*Primary Examiner* — Joshua Benitez Rosario
*Assistant Examiner* — Scott E Bauman
(74) *Attorney, Agent, or Firm* — Muir Patent Law, PLLC

(57) ABSTRACT

A semiconductor device includes bit lines extending in a first direction on a substrate, a lower contact connected to the substrate between two adjacent ones of the bit lines, a landing pad on the lower contact, and an insulating structure surrounding a sidewall of the landing pad, the insulating structure including a first insulating pattern having a top surface at a lower level than a top surface of the landing pad, and a second insulating pattern on the top surface of the first insulating pattern.

19 Claims, 37 Drawing Sheets

(56)                    References Cited

U.S. PATENT DOCUMENTS

2020/0203354  A1       6/2020  Lee et al.
2020/0402982  A1*  12/2020  Park ..................... H10B 12/315
2021/0296321  A1*    9/2021  Heo ................... H01L 21/7682

FOREIGN PATENT DOCUMENTS

KR        10-2012-0118323  A      10/2012
KR        10-2013-0128502  A      11/2013
KR        10-2016-0139190  A      12/2016
KR        10-2017-0028666  A       3/2017
KR        10-2018-0072901  A       7/2018
KR        10-2019-0130928  A      11/2019
KR        10-2020-0053809  A       5/2020
TW                201034170  A1      9/2010

* cited by examiner

FIG. 2
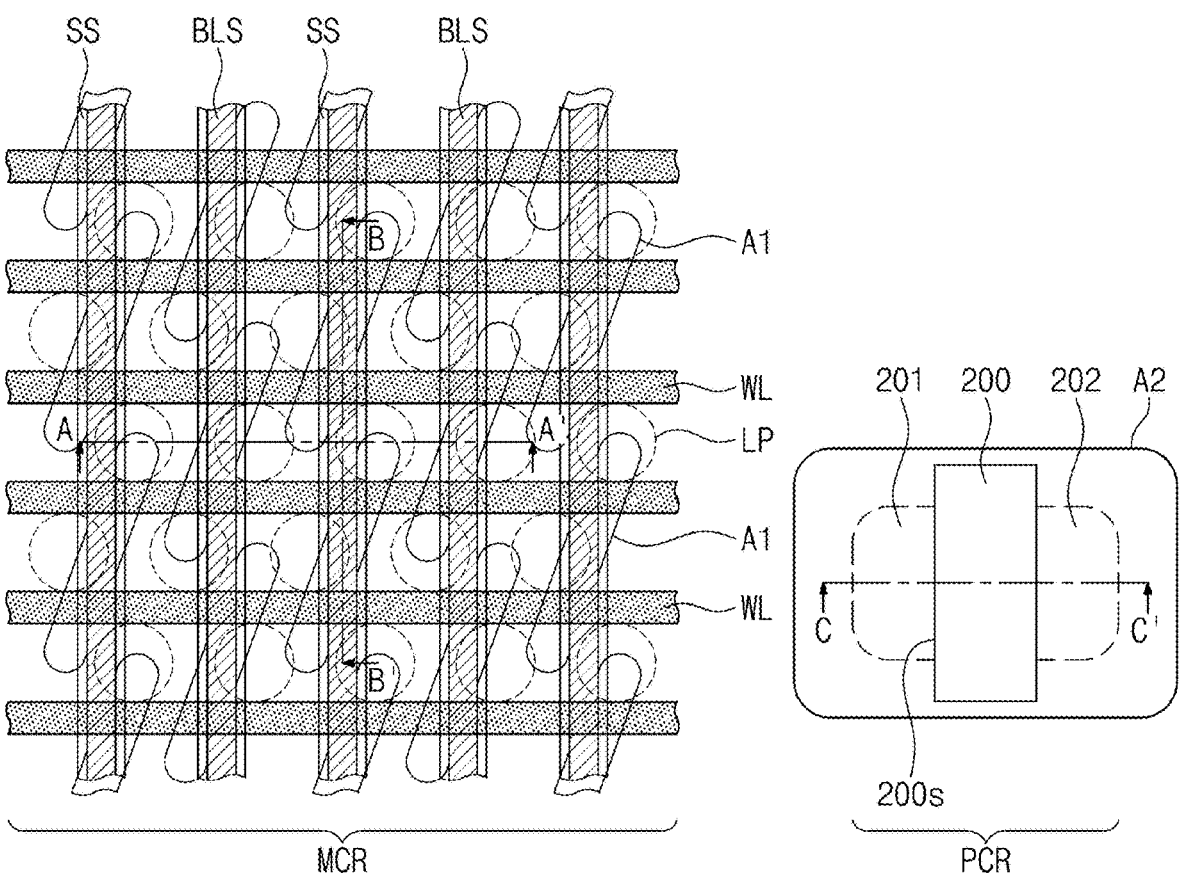
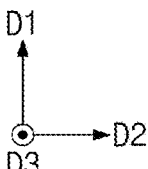

FIG. 4
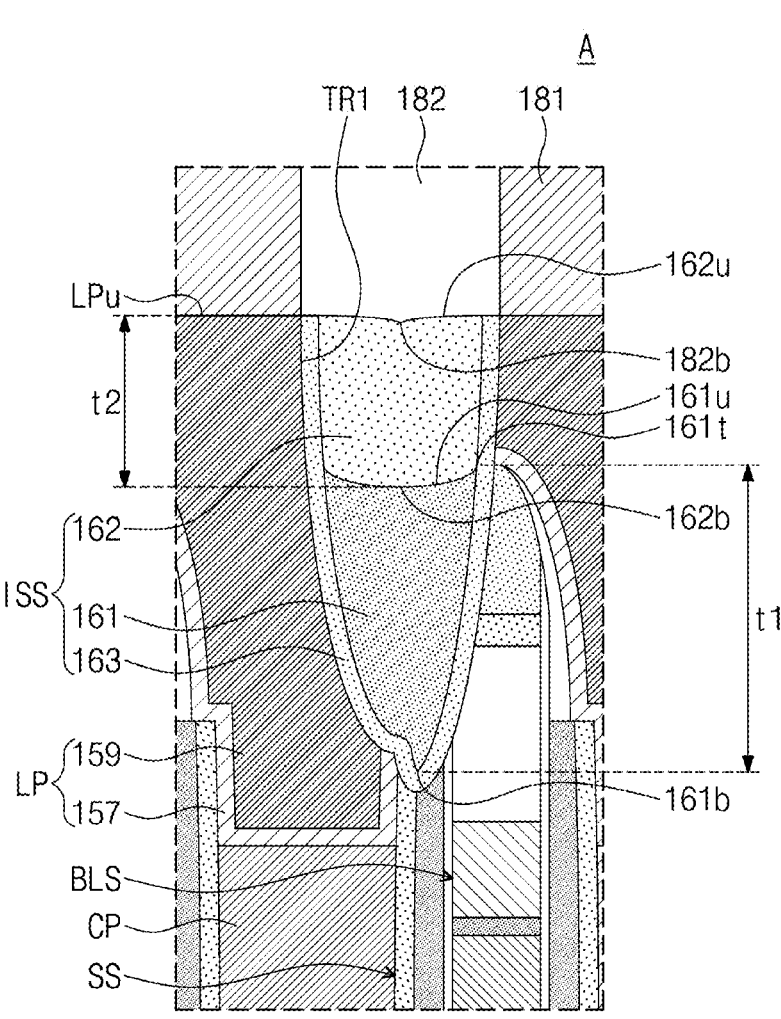
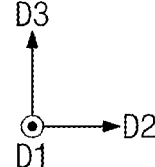

FIG. 5
MCR
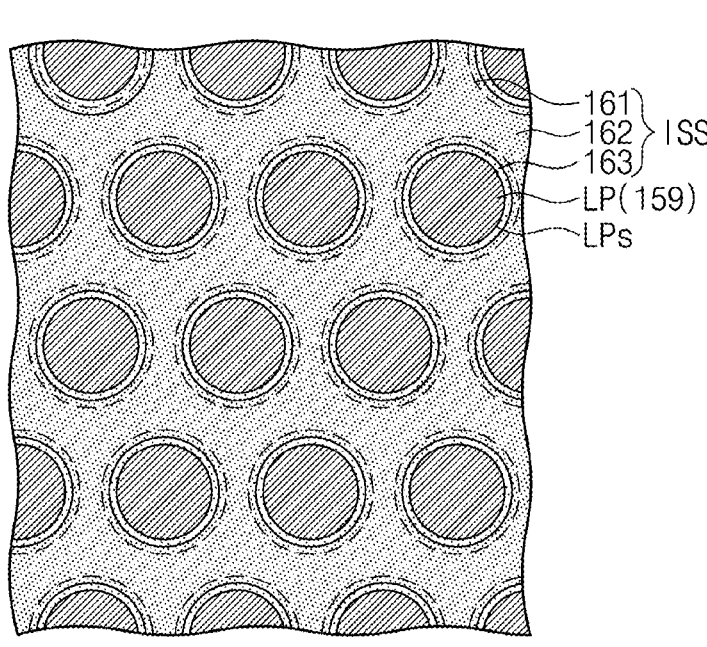
161 ⎫
162 ⎬ ISS
163 ⎭
LP(159)
LPs
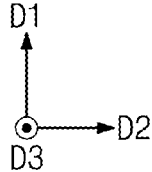

B  TR2

270

263
252
262
261

251
253
241
242  240
243
207

230
223
222
221  220  200
225
210
209

201

202

A2

100

C                                                    C'

PCR

SEMICONDUCTOR DEVICE INCLUDING AN INSULATING STRUCTURE ON A SIDEWALL OF A LANDING PAD

CROSS-REFERENCE TO RELATED APPLICATION

This U.S. non-provisional patent application claims priority under 35 U.S.C. § 119 to Korean Patent Application No. 10-2021-0055093, filed on Apr. 28, 2021, in the Korean Intellectual Property Office, the disclosure of which is hereby incorporated by reference in its entirety.

BACKGROUND

1. Field

Embodiments relate to a semiconductor device and, more particularly, to a semiconductor device including an insulating structure on a sidewall of a landing pad.

2. Description of the Related Art

Semiconductor devices are widely used in the electronic industry because of their small sizes, multi-functional characteristics, and/or low manufacturing costs. Semiconductor devices may be categorized as semiconductor memory devices for storing logical data, semiconductor logic devices for processing logical data, and hybrid semiconductor devices having both the function of the semiconductor memory devices and the function of the semiconductor logic devices.

SUMMARY

In an aspect, a semiconductor device may include bit lines extending in a first direction on a substrate, a lower contact connected to the substrate between two bit lines, adjacent to each other, of the bit lines, a landing pad on the lower contact, and an insulating structure surrounding a sidewall of the landing pad. The insulating structure may include a first insulating pattern having a top surface located at a lower level than a top surface of the landing pad, and a second insulating pattern on the top surface of the first insulating pattern.

In an aspect, a semiconductor device may include a substrate including active regions and a device isolation layer defining the active regions, word lines intersecting the active regions and extending in a first direction, bit line structures extending in a second direction perpendicular to the first direction on the word lines, spacer structures on sidewalls of the bit line structures, a lower contact disposed between the spacer structures and connected to the active region, a landing pad disposed on the lower contact and extending onto a top surface of the bit line structure, the landing pad including a pad metal pattern and a barrier layer between the pad metal pattern and the lower contact, an insulating structure surrounding a sidewall of the landing pad, the insulating structure including a first insulating pattern, a second insulating pattern on the first insulating pattern, and an interface layer between the first insulating pattern and the sidewall of the landing pad, an upper electrode on a top surface of the landing pad, and an upper insulating layer on the second insulating pattern. The first insulating pattern may have a top surface located at a lower level than the top surface of the landing pad.

In an aspect, a semiconductor device may include a gate stack on a substrate, the gate stack including a gate electrode and a gate capping pattern on the gate electrode, a gate spacer structure on a sidewall of the gate stack, an interlayer insulating layer on a top surface of the gate stack and a top surface of the gate spacer structure, peripheral circuit wiring lines on a top surface of the interlayer insulating layer, a first wiring insulating pattern vertically overlapping with the gate electrode and filling a lower portion of a trench between the peripheral circuit wiring lines, and a second wiring insulating pattern extending from top surfaces of the peripheral circuit wiring lines into the trench. A bottom end of the first wiring insulating pattern may be located at a lower level than the top surface of the interlayer insulating layer.

BRIEF DESCRIPTION OF THE DRAWINGS

Features will become apparent to those of skill in the art by describing in detail exemplary embodiments with reference to the attached drawings, in which:

FIG. 2 is a plan view of a portion of a semiconductor device according to some embodiments.

FIG. 4 is an enlarged cross-sectional view of portion 'A' of FIG. 3.

FIG. 5 is a horizontal-sectional view corresponding to a first level LV1 of FIG. 3 to illustrate a portion of a cell region of a semiconductor device according to some embodiments.

FIGS. 12A to 12F are cross-sectional views corresponding to lines A-A' and C-C' of FIG. 2 to illustrate stages in a method of manufacturing a semiconductor device according to some embodiments.

DETAILED DESCRIPTION

Figure 1:
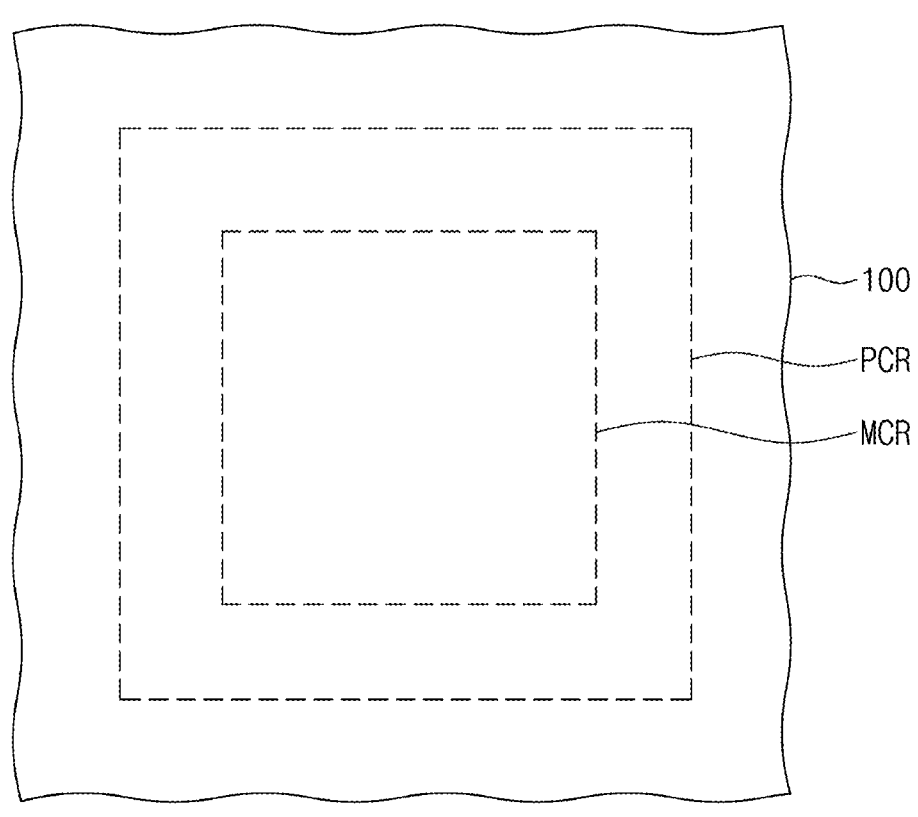
FIG. 1 is a schematic plan view of a portion of a semiconductor device according to some embodiments.

FIG. 1 is a schematic plan view of a portion of a semiconductor device according to some embodiments.

Referring to FIG. 1, a semiconductor device according to some embodiments may include a substrate 100 on which a cell region MCR and a peripheral region PCR are formed. The cell region MCR may include a memory cell. The cell region MCR may include at least one of a memory cell of a volatile memory device or a memory cell of a non-volatile memory device. In some embodiments, the cell region MCR may include a memory cell of a dynamic random access memory (DRAM) device. The cell region MCR may include a plurality of unit memory cells for storing data. Each of the unit memory cells may include at least one transistor and at least one capacitor.

The peripheral region PCR may be provided to be adjacent to the cell region MCR. The peripheral region PCR may be provided at one or more sides of the cell region MCR. For example, the peripheral region PCR may surround, e.g., an entire perimeter of, the cell region MCR when viewed in a plan view. A device isolation layer for isolating the cell region MCR from the peripheral region PCR may be provided between the cell region MCR and the peripheral region PCR.

The peripheral region PCR may include circuits for driving the cell region MCR. In some embodiments, the peripheral region PCR may include a core region of the DRAM device. The core region may include, e.g., a sense amplifier and a write driver. In some embodiments, the peripheral region PCR may include a peripheral circuit region of the DRAM device. The peripheral circuit region may include, e.g., a row decoder and a column decoder.

Figure 3:
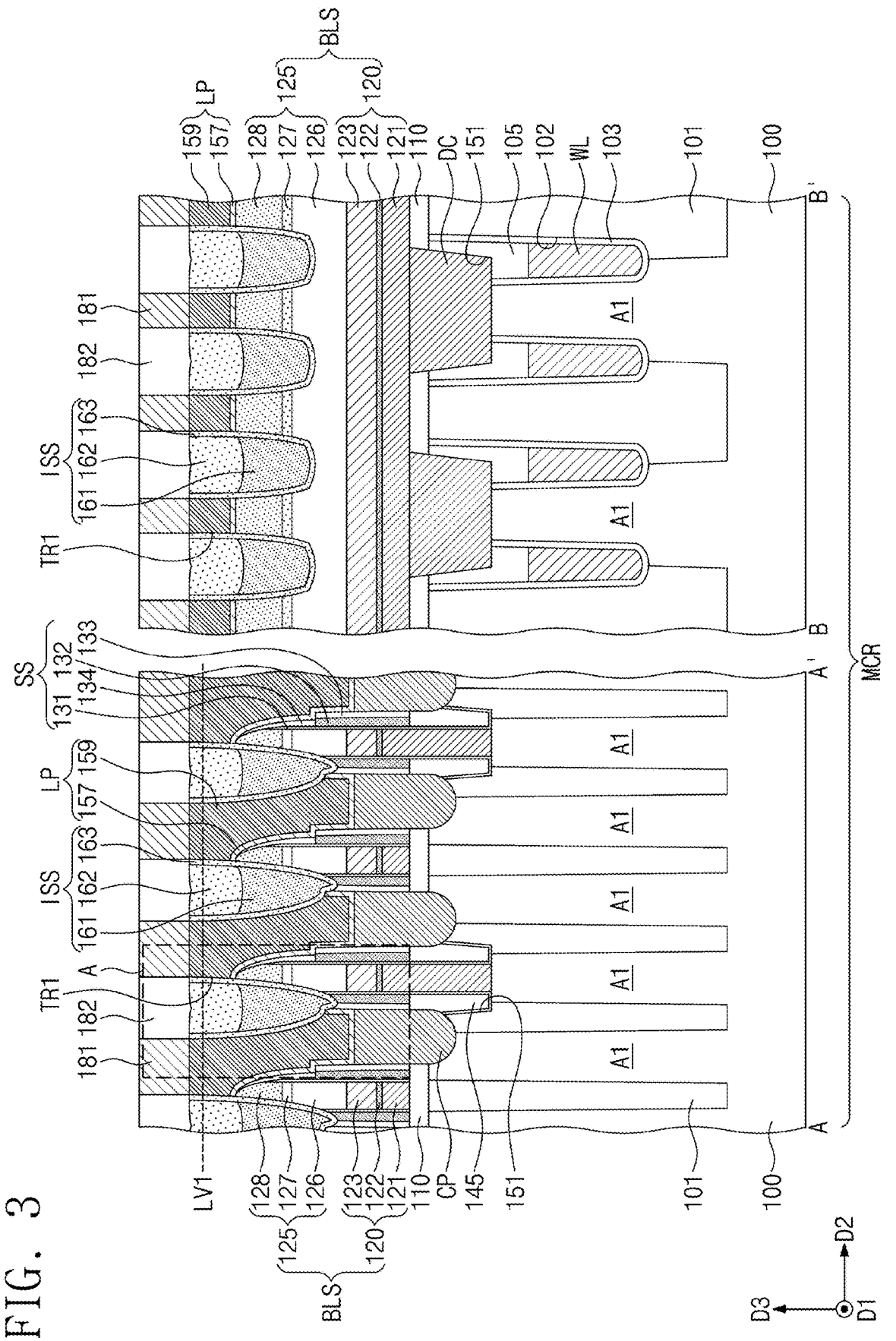
FIG. 3 is a cross-sectional view taken along lines A-A' and B-B' of FIG. 2.

FIG. 2 is a plan view partially illustrating a cell region and a peripheral region of a semiconductor device according to some embodiments. FIG. 3 is a cross-sectional view taken along lines A-A' and B-B' of FIG. 2. FIG. 4 is an enlarged cross-sectional view of portion 'A' of FIG. 3.

Referring to FIGS. 2 and 3, a device isolation layer 101 defining first active regions A1 may be disposed in the substrate 100 of the cell region MCR. For example, the substrate 100 may be a semiconductor substrate including silicon, germanium, or silicon-germanium.

The first active regions A1 may be provided in an upper portion of the substrate 100. The first active regions A1 may be portions remaining in the upper portion of the substrate 100 after a patterning process performed on the substrate 100. Each of the first active regions A1 may have a rectangular shape (or a bar shape) when viewed in a plan view. The first active regions A1 may be two-dimensionally arranged in a first direction D1 and a second direction D2. Each of the first active regions A1 may have a long axis parallel to a diagonal direction to the first direction D1 and the second direction D2. A width of each of the first active regions A1 may decrease as a height from a bottom surface of the substrate 100 increases. In other words, each of the first active regions A1 may have a width which decreases toward a direction (i.e., a third direction D3) perpendicular to a top surface of the substrate 100.

Word lines WL may be disposed in the substrate 100. The word lines WL may extend in the second direction D2 to intersect the first active regions A1 and the device isolation layer 101. The word lines WL may be arranged, e.g., spaced apart from each other, in the first direction D1. A gate insulating layer 103 may be disposed between the substrate 100 and the word lines WL.

For example, gate recess regions 102 may be formed in the first active regions A1 and the device isolation layer 101. The gate insulating layer 103 may conformally cover inner surfaces of the gate recess regions 102. The word lines WL may fill lower portions of the gate recess regions 102. The word lines WL may be spaced apart from the first active regions A1 and the device isolation layer 101 with the gate insulating layer 103 interposed therebetween. Top surfaces of the word lines WL may be lower than the top surface of the substrate 100. Hard mask patterns 105 may be disposed on the top surfaces of the word lines WL to fill remaining portions of the gate recess regions 102. Top surfaces of the hard mask patterns 105 may be located at substantially the same level as the top surface of the substrate 100.

Bit line structures BLS may extend in the first direction D1 to intersect the first active regions A1. The bit line structures BLS may be insulated from the word lines WL and may intersect the word lines WL. Each of the bit line structures BLS may include a bit line 120 and a bit line capping pattern 125 on the bit line 120.

The bit line 120 may include a poly-silicon pattern 121, a silicide pattern 122, and a metal pattern 123, which are sequentially stacked. A lower insulating layer 110 may be disposed between the poly-silicon pattern 121 and the substrate 100, and a portion (hereinafter, referred to as a bit line contact pattern DC) of the poly-silicon pattern 121 may penetrate the lower insulating layer 110 so as to be in contact with the first active region A1. In other words, the bit line 120 may be electrically connected to the first active region A1 through the bit line contact pattern DC. A bottom surface of the bit line contact pattern DC may be lower than the top surface of the substrate 100 and may be higher than the top surfaces of the word lines WL. The bit line contact pattern DC may be locally disposed in a recess region 151 which is formed in the substrate 100 to expose a top surface of the first active region A1. The recess region 151 may have an elliptical shape when viewed in a plan view, and a width of the recess region 151 in a short-axis direction may be greater than a width of each of the bit line structures BLS.

The bit line capping pattern 125 may be disposed on the metal pattern 123 of the bit line 120. The bit line capping pattern 125 may include a first capping pattern 126, a second capping pattern 127, and a third capping pattern 128.

A bit line contact spacer 145 may fill a remaining portion of the recess region 151 in which the bit line contact pattern DC is formed. For some examples, the bit line contact spacer 145 may cover both sidewalls of the bit line contact pattern DC. For certain examples, the bit line contact spacer 145 may surround sidewalls of the bit line contact pattern DC in the recess region 151. The bit line contact spacer 145 may be formed of an insulating material having an etch selectivity with respect to the lower insulating layer 110. For example, the bit line contact spacer 145 may include a silicon oxide layer, a silicon nitride layer, and/or a silicon oxynitride layer and may be formed of a multi-layer. In some embodiments, a top surface of the bit line contact spacer 145 may be located at substantially the same level as a top surface of the lower insulating layer 110.

Lower contacts CP may be disposed between sidewalls of the bit line structures BLS. The lower contacts CP may be arranged in the first direction D1 on the sidewall of the bit line structure BLS. Each of the lower contacts CP may be disposed between the word lines WL and between the bit line structures BLS when viewed in a plan view. Each of the lower contacts CP may be connected to the substrate 100 between two bit lines 120 adjacent to each other. The lower contact CP may be electrically connected to the first active region A1 of the substrate 100. The lower contact CP may include, e.g., poly-silicon doped with dopants.

A bottom end of the lower contact CP may be lower than the top surface of the substrate 100 and may be higher than the bottom surface of the bit line contact pattern DC. A top surface of the lower contact CP may be located at a lower level than a bottom surface of the bit line capping pattern 125 of the bit line structure BLS. The lower contact CP may be insulated from the bit line contact pattern DC by the bit line contact spacer 145.

A landing pad LP may be disposed on the lower contact CP. The landing pad LP may be electrically connected to the first active region A1 of the substrate 100 through the lower contact CP. A top surface of the landing pad LP may be higher than the top surfaces of the bit line structures BLS, and a bottom surface of the landing pad LP may be lower than the top surfaces of the bit line structures BLS. For example, the bottom surface of the landing pad LP may be located at a lower level than the top surface of the metal pattern 123 of the bit line 120. The landing pad LP may include a barrier layer 157 and a pad metal pattern 159, which are sequentially stacked. In some embodiments, a contact silicide pattern may be provided between the lower contact CP and the landing pad LP.

A spacer structure SS may be provided between the lower contact CP and the bit line structure BLS. The spacer structure SS may extend in the first direction D1 along the sidewalls of the bit line structures BLS. The spacer structure SS may include a first spacer 131, a second spacer 132, a third spacer 133, and a fourth spacer 134. The first spacer 131 may be disposed directly on the sidewall of the bit line structure BLS. The second spacer 132 may be disposed between the first spacer 131 and the lower contact CP. The third spacer 133 may be disposed between the second spacer 132 and the lower contact CP. The second spacer 132 may be located between the first spacer 131 and the third spacer 133. The first spacer 131 and the third spacer 133 may include an insulating material having an etch selectivity with respect to the lower insulating layer 110.

The second spacer 132 may include an insulating material having a dielectric constant lower than those of the first spacer 131 and the third spacer 133. For some examples, each of the first spacer 131 and the third spacer 133 may include a silicon nitride layer, and the second spacer 132 may include a silicon oxide layer. For certain examples, the second spacer 132 may include air. In other words, the second spacer 132 may be an air spacer defined between a sidewall of the first spacer 131 and a sidewall of the third spacer 133. The fourth spacer 134 may be provided on a top surface of the second spacer 132 and on the sidewall of the first spacer 131. The fourth spacer 134 may surround a sidewall of a lower portion of the landing pad LP. The fourth spacer 134 may have a ring shape when viewed in a plan view.

FIG. 5 is a horizontal-sectional view corresponding to a first level LV1 of FIG. 3 to illustrate a portion of a cell region of a semiconductor device according to some embodiments.

Referring to FIGS. 2 to 5, an insulating structure ISS may fill a space between the landing pads LP. The insulating structure ISS may surround, e.g., an entire perimeter of each of, sidewalls LPs of the landing pads LP, as illustrated in FIG. 5. The insulating structure ISS may include a first insulating pattern 161, a second insulating pattern 162, and an interface layer 163.

The insulating structure ISS may be provided in a first trench TR1 between the sidewalls of the landing pads LP, as illustrated in FIG. 3. The first trench TR1 may be a node isolation trench electrically isolating the landing pads LP from each other. The landing pads LP may be spaced apart from each other with the first trench TR1 interposed therebetween. The first trench TR1 may have an inner surface defined by surfaces of the landing pads LP, the bit line structures BLS, and the spacer structures SS.

The first insulating pattern 161 may fill a lower portion of the first trench TR1. The first insulating pattern 161 may be spaced apart from the inner surface of the first trench TR1 (i.e., the surfaces of the landing pads LP, the bit line structures BLS, and the spacer structures SS) with the interface layer 163 interposed therebetween. The first insulating pattern 161 may have a top surface 161u located at a lower level than the top surface LPu of the landing pad LP.

The top surface 161u of the first insulating pattern 161 may be located at a lower level than a topmost surface of the barrier layer 157. The top surface 161u of the first insulating pattern 161 may have a shape concavely recessed toward the substrate 100. The lowest portion of the top surface 161u of the first insulating pattern 161 may be located at a lower level than a topmost surface of the bit line structure BLS. The first insulating pattern 161 may have a bottom end 161b convexly protruding toward the substrate 100. The bottom end 161b of the first insulating pattern 161 may vertically overlap with the spacer structure SS. The bottom end 161b of the first insulating pattern 161 may be located at a higher level than a bottom end of the bit line capping pattern 125.

The second insulating pattern 162 may be provided on the top surface 161u of the first insulating pattern 161. The second insulating pattern 162 may completely cover the top surface 161u of the first insulating pattern 161. A bottom surface 162b of the second insulating pattern 162 may have a shape convexly protruding toward the substrate 100. The bottom surface 162b of the second insulating pattern 162 may have a shape corresponding to that of the top surface 161u of the first insulating pattern 161, and may be in direct contact with the top surface 161u of the first insulating pattern 161. A top surface 162u of the second insulating pattern 162 may be located at a level which is not higher than the top surface LPu of the landing pad LP. In other words, the level of the top surface 162u of the second insulating pattern 162 may be substantially the same as or lower than the level of the top surface LPu of the landing pad LP. The top surface 162u of the second insulating pattern 162 may have a concavely recessed shape. The second insulating pattern 162 may include a different material from that of the first insulating pattern 161.

The interface layer 163 may conformally cover the inner surface of the first trench TR1. The interface layer 163 may be disposed between the first insulating pattern 161 and the inner surface of the first trench TR1 and between the second insulating pattern 162 and the inner surface of the first trench TR1. The first insulating pattern 161 and the second insulating pattern 162 may be spaced apart from the sidewall of the landing pad LP by the interface layer 163. The interface layer 163 may have a bottom end convexly protruding toward the substrate 100. The bottom end of the interface layer 163 may vertically overlap with the spacer structure SS. A top surface of the interface layer 163 may be located at a level which is not higher than the top surface LPu of the landing pad LP. In other words, the level of the top surface of the interface layer 163 may be substantially the same as or lower than the level of the top surface LPu of the landing pad LP. In some embodiments, the top surface of the interface layer 163 may be substantially coplanar with the top surface 162u of the second insulating pattern 162. In some embodiments, the top surface of the interface layer 163, the top surface 162u of the second insulating pattern 162, and the top surface LPu of the landing pad LP may be substantially coplanar with each other.

The first insulating pattern 161 may have a hydrogen concentration higher than that of the second insulating pattern 162. For example, the first insulating pattern 161 may have a hydrogen atomic percent higher than those of the second insulating pattern 162 and the interface layer 163. For example, the first insulating pattern 161 may have a hydrogen ion concentration higher than those of the second insulating pattern 162 and the interface layer 163. The first insulating pattern 161 may have an oxygen concentration higher than that of the second insulating pattern 162. For example, the first insulating pattern 161 may have an oxygen atomic percent higher than those of the second insulating pattern 162 and the interface layer 163.

In some embodiments, the first insulating pattern 161 may include silicon oxide or silicon oxynitride, which has a high hydrogen concentration. For example, the first insulating pattern 161 may include a silicon oxide layer formed by providing hydroxide ions (OH⁻) or hydrogen ions (H⁺) into fluorosilicate glass (FSG). For example, the first insulating pattern 161 may include a silicon oxynitride layer which includes hydrogen atoms by a plasma deposition process using $N_2/SiH_4$ gases or $NH_3/SiH_4$ gases. For example, the first insulating pattern 161 may include a silicon oxide layer which includes hydrogen by a plasma deposition process using $N_2O/SiH_4$ gases.

Hydrogen contained in the first insulating pattern 161 may be diffused onto surfaces of adjacent components to reduce a trap density of the surfaces of the adjacent components. The surface traps may be dangling bonds. For example, hydrogen contained in the first insulating pattern 161 may be diffused to an etched surface of the upper portion of the substrate 100 so as to be combined with the dangling bonds existing as 'Si—' on the etched surface of the substrate 100. The diffused hydrogen may form Si—H bonds with the dangling bonds on the substrate 100. Thus, a recombination phenomenon by minority carriers may be reduced, and a leakage current by the surface traps may be reduced.

Each of the second insulating pattern 162 and the interface layer 163 may have an oxygen concentration lower than that of the first insulating pattern 161. For example, the second insulating pattern 162 and the interface layer 163 may include silicon nitride. The second insulating pattern 162 and the interface layer 163 may prevent the first insulating pattern 161 from being in contact with the landing pads LP or upper electrodes 181 and may prevent deterioration of the landing pads LP and the upper electrodes 181. In some embodiments, the second insulating pattern 162 and the interface layer 163 may include the same material. In some embodiments, the second insulating pattern 162 and the interface layer 163 may be connected to each other to constitute one body, and an interface therebetween may not be observed.

The first insulating pattern 161 and the second insulating pattern 162 may extend in the first direction D1 and the second direction D2 which are parallel to the top surface of the substrate 100, as illustrated in FIG. 5. A thickness t1 of the first insulating pattern 161, e.g., along the third direction D3, may be greater than a thickness t2 of the second insulating pattern 162, e.g., along the third direction D3. In other words, a distance t1 in the third direction D3 between the bottom end 161b of the first insulating pattern 161 and a top end 161t of the first insulating pattern 161 may be greater than a distance t2 in the third direction D3 between a bottom end of the second insulating pattern 162 and a top end of the second insulating pattern 162. The first insulating pattern 161 may have a horizontal section area which becomes progressively greater from its bottom end 161b toward the bottom end of the second insulating pattern 162.

The upper electrodes 181 may be provided on the landing pads LP, respectively. The upper electrodes 181 may be electrically connected to the landing pads LP, respectively. A cell upper insulating layer 182 may be provided between the upper electrodes 181. The cell upper insulating layer 182 may cover sidewalls of the upper electrodes 181 and the top surface 162u of the second insulating pattern 162. The cell upper insulating layer 182 may have a portion protruding toward the first insulating pattern 161. The cell upper insulating layer 182 may have a bottommost end 182b located at a lower level than the top surface LPu of the landing pad LP.

In some embodiments, each of the upper electrodes 181 may be a portion of a data storage element. The data storage element may be a capacitor. For example, the upper electrode 181 may form the capacitor with another electrode. For example, the upper electrodes 181 may include doped silicon, Ru, RuO, Pt, PtO, Ir, IrO, SrRuO (SRO), (Ba,Sr)RuO (BSRO), MCRuO (CRO), BaRuO, La(Sr,Co)O, Ti, TiN, W, WN, Ta, TaN, TiAlN, TiSiN, TaAlN, TaSiN, or any combination thereof. The cell upper insulating layer 182 may be a high-k dielectric layer disposed between the electrodes constituting the capacitor. For example, the cell upper insulating layer 182 may include hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof.

In certain embodiments, each of the upper electrodes 181 may be a conductive pad for electrically connecting the landing pad LP to a data storage element. In this case, the upper electrodes 181 may include at least one of, e.g., titanium, tantalum, tungsten, copper, or aluminum. The cell upper insulating layer 182 may be an interlayer insulating layer located under the data storage element. In this case, the cell upper insulating layer 182 may include at least one of, e.g., silicon oxide, silicon nitride, or silicon oxynitride.

Figure 6:
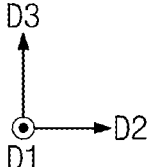
FIG. 6 is a cross-sectional view taken along line C-C' of FIG. 2.
Figure 7:
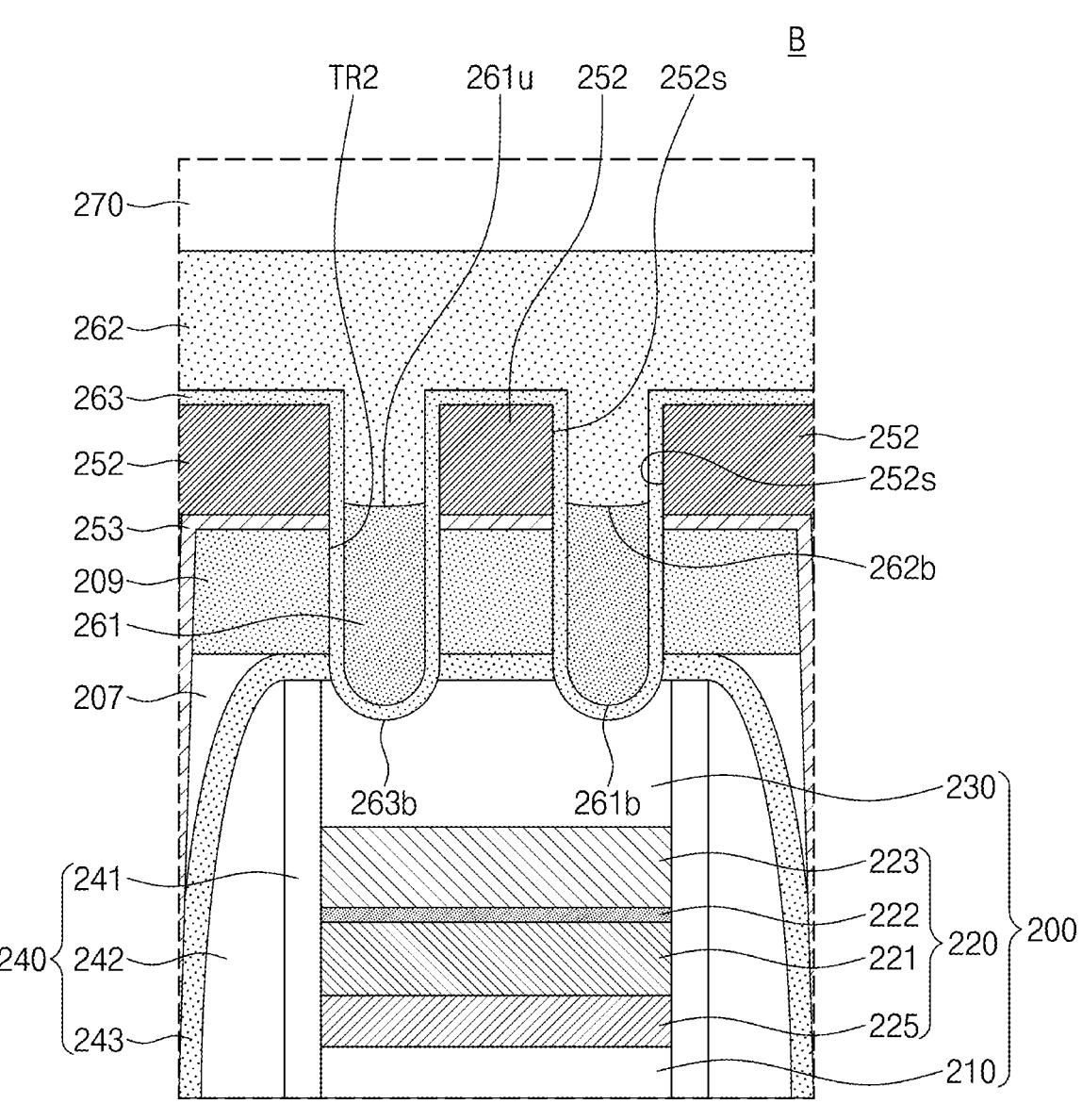
FIG. 7 is an enlarged cross-sectional view of portion 'B' of FIG. 6.

FIG. 6 is a cross-sectional view taken along line C-C' of FIG. 2. FIG. 7 is an enlarged cross-sectional view of portion 'B' of FIG. 6.

Referring to FIGS. 2, 6 and 7, a gate stack 200 may be disposed on the substrate 100 of the peripheral region PCR. The gate stack 200 may extend in a direction parallel to the top surface of the substrate 100. The gate stack 200 may have, e.g., a bar shape when viewed in a plan view. The gate stack 200 may be disposed on a second active region A2 defined in an upper portion of the substrate 100. The second active region A2 may be a region doped with N-type or P-type dopants and may be defined by a device isolation layer.

Dopant regions 201 and 202 may be formed in the upper portion of the substrate 100. The dopant regions 201 and 202 may include dopants having a different conductivity type from that of the dopants contained in the second active region A2. The dopant regions 201 and 202 may be a source region and a drain region which are electrically connected to or isolated from each other, according to a voltage applied to the gate stack 200. The dopant regions 201 and 202 may be spaced apart from each other with the gate stack 200 interposed therebetween, when viewed in a plan view. The dopant regions 201 and 202 may be disposed adjacent to both sidewalls 200s of the gate stack 200, respectively. For example, the gate stack 200 and the dopant regions 201 and 202 may constitute a PMOS transistor, and the dopant regions 201 and 202 may be P-type dopant regions. In this case, the dopant regions 201 and 202 may include at least one of, e.g., boron (B), aluminum (Al), gallium (Ga), or indium (In). For certain examples, the gate stack 200 and the dopant regions 201 and 202 may constitute an NMOS transistor, and the dopant regions 201 and 202 may be N-type dopant regions. In this case, the dopant regions 201 and 202 may include at least one of, e.g., phosphorus (P), arsenic (As), or antimony (Sb).

The gate stack 200 may include a gate insulating layer 210, a gate electrode 220, and a gate capping pattern 230.

The gate insulating layer 210 may be disposed between the top surface of the substrate 100 and the gate electrode 220. The gate capping pattern 230 may be disposed on a top surface of the gate electrode 220.

The gate insulating layer 210 may include a dielectric. In some embodiments, the gate insulating layer 210 may include a first dielectric layer and a second dielectric layer on the first dielectric layer. The first dielectric layer may have a dielectric constant lower than that of the second dielectric layer. For example, the first dielectric layer may include at least one of a silicon oxide layer or a silicon oxynitride layer. The second dielectric layer may include a high-k dielectric material of which a dielectric constant is higher than that (or those) of the silicon oxide layer and/or the silicon oxynitride layer. For example, the second dielectric layer may include an oxide, nitride, silicide or oxynitride, which includes at least one of hafnium (Hf), aluminum (Al), zirconium (Zr), or lanthanum (La).

The gate electrode 220 may include a work function control layer 225, a first conductive layer 221, a second conductive layer 222, and a third conductive layer 223, which are sequentially stacked. The work function control layer 225 may control or adjust a threshold voltage of the transistor. In some embodiments, a thickness of the work function control layer 225 may be greater than a thickness of the gate insulating layer 210. The work function control layer 225 may include at least one of a P-type metal layer or an N-type metal layer. For example, the work function control layer 225 may include at least one of Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, or TaC. For example, the work function control layer 225 may further include at least one of La/TiN, Mg/TiN, or Sr/TiN.

The first conductive layer 221 may include a doped semiconductor material. For example, the first conductive layer 221 may include poly-silicon. The first conductive layer 221 may be doped with, e.g., P-type dopants.

The second conductive layer 222 may be formed between the first conductive layer 221 and the third conductive layer 223. A thickness of the second conductive layer 222 may be less than thicknesses of the first and third conductive layers 221 and 223. The second conductive layer 222 may include a silicide formed at an interface between the first conductive layer 221 and the third conductive layer 223. For example, the second conductive layer 222 may include titanium silicide, cobalt silicide, nickel silicide, tungsten silicide, platinum silicide, and/or molybdenum silicide. The third conductive layer 223 may include a metal. For example, the third conductive layer 223 may include at least one of W, Ti, or Ta.

The gate capping pattern 230 may be disposed on the top surface of the gate electrode 220. The gate capping pattern 230 may cover a top surface of the third conductive layer 223 to protect the gate electrode 220. The gate capping pattern 230 may include an insulating material. For example, the gate capping pattern 230 may include silicon nitride.

A gate spacer structure 240 may be disposed on the sidewalls 200s of the gate stack 200. The gate spacer structure 240 may include a first gate spacer 241, a second gate spacer 242, and a third gate spacer 243.

The first gate spacer 241 may be disposed directly on the sidewall 200s of the gate stack 200. The first gate spacer 241 may vertically extend along the sidewall 200s of the gate stack 200. The first gate spacer 241 may have an oxygen content lower than that of the second gate spacer 242. The first gate spacer 241 may have a first dielectric constant, and the first dielectric constant may range from 6.5 to 7.5. The first gate spacer 241 may include a material having an etch selectivity with respect to the second gate spacer 242. The first gate spacer 241 may include, e.g., silicon nitride. A top surface of the first gate spacer 241 may be substantially coplanar with a top surface of the gate capping pattern 230. The first gate spacer 241 may be disposed directly on a sidewall of the gate electrode 220 and a sidewall of the gate capping pattern 230.

The second gate spacer 242 may be disposed on a sidewall of the first gate spacer 241. A width of the second gate spacer 242 may be greater than a width of the first gate spacer 241, e.g., a maximal width of the second gate spacer 242 may be greater than a width of the first gate spacer 241. The width of the second gate spacer 242 may decrease as a distance from the top surface of the substrate 100 increases. The second gate spacer 242 may include, e.g., silicon oxide.

The third gate spacer 243 may be provided on the second gate spacer 242. The third gate spacer 243 may extend onto a top surface of the gate stack 200 to cover the top surface of the first gate spacer 241 and the top surface of the gate capping pattern 230. The third gate spacer 243 may extend onto the top surface of the substrate 100. The third gate spacer 243 may include, e.g., silicon nitride.

A first interlayer insulating layer 207 may be formed on the substrate 100. The first interlayer insulating layer 207 may cover a sidewall of the gate spacer structure 240 and may not cover a top surface of the gate spacer structure 240. A top surface of the first interlayer insulating layer 207 may be substantially coplanar with a top surface of the third gate spacer 243. For example, the first interlayer insulating layer 207 may include a high density plasma (HDP) oxide layer, or a silicon oxide layer formed by a flowable CVD (FCVD) method. A second interlayer insulating layer 209 may be formed on the first interlayer insulating layer 207. A bottom surface of the second interlayer insulating layer 209 may cover the top surface of the third gate spacer 243. The second interlayer insulating layer 209 may include silicon nitride.

Peripheral circuit wiring lines 252 may be provided on the second interlayer insulating layer 209. The peripheral circuit wiring lines 252 may be connected to the dopant regions 201 and 202 through peripheral contacts 251. For example, the peripheral contact 251 and the peripheral circuit wiring line 252 may include at least one of copper (Cu), tungsten (W), aluminum (Al), tantalum (Ta), or titanium (Ti). The peripheral contact 251 may penetrate the first and second interlayer insulating layers 207 and 209 so as to be connected to the substrate 100. In some embodiments, a bottom end of the peripheral contact 251 may be located at a lower level than the top surface of the substrate 100. The peripheral contacts 251 may electrically connect the peripheral circuit wiring lines 252 to the dopant regions 201 and 202. In some embodiments, the peripheral contact 251 may be formed together with the peripheral circuit wiring line 252 and may include the same material as the peripheral circuit wiring line 252. The peripheral contact 251 and the peripheral circuit wiring line 252 may be connected to each other to constitute one body.

A contact barrier layer 253 may cover surfaces of the peripheral circuit wiring line 252 and the peripheral contact 251. The contact barrier layer 253 may be provided between a bottom surface of the peripheral circuit wiring line 252 and the second interlayer insulating layer 209. The contact barrier layer 253 may be provided on a sidewall and a bottom surface of the peripheral contact 251. The contact barrier layer 253 may include a metal nitride. For example, the contact barrier layer 253 may include at least one of titanium nitride (TiN), tantalum nitride (TaN), or tungsten nitride (WN).

A second trench TR2 may be formed between the peripheral circuit wiring lines 252. The second trench TR2 may be formed between sidewalls of the peripheral circuit wiring lines 252 and may penetrate the second interlayer insulating layer 209 and the third gate spacer 243. A bottom end of the second trench TR2 may be located at a lower level than the top surface of the gate capping pattern 230.

The first wiring insulating pattern 261 may fill a lower portion of the second trench TR2. A bottom end 261b of the first wiring insulating pattern 261 may be located at a lower level than a bottom surface of the second interlayer insulating layer 209. A top surface 261u of the first wiring insulating pattern 261 may have a shape concavely recessed toward the substrate 100.

A second wiring insulating pattern 262 may extend from top surfaces of the peripheral circuit wiring lines 252 into the second trench TR2. In other words, the second wiring insulating pattern 262 may include a first portion on the top surfaces of the peripheral circuit wiring lines 252, and a second portion filling an upper portion of the second trench TR2. In some embodiments, a bottom end 262b of the second wiring insulating pattern 262 may be lower than the top surfaces of the peripheral circuit wiring lines 252 and may be higher than the bottom surfaces of the peripheral circuit wiring lines 252.

A wiring interface layer 263 may cover an inner surface of the second trench TR2 and the top surfaces of the peripheral circuit wiring lines 252. The wiring interface layer 263 may be disposed between the second wiring insulating pattern 262 and the top surfaces of the peripheral circuit wiring lines 252. In addition, the wiring interface layer 263 may be disposed between the inner surface of the second trench TR2 and the first wiring insulating pattern 261 and between the inner surface of the second trench TR2 and the second wiring insulating pattern 262. The wiring interface layer 263 and the second wiring insulating pattern 262 may include silicon nitride.

The first wiring insulating pattern 261 may have a hydrogen concentration higher than that of the second wiring insulating pattern 262. For example, the first wiring insulating pattern 261 may have a hydrogen atomic percent higher than those of the second wiring insulating pattern 262 and the wiring interface layer 263. For example, the first wiring insulating pattern 261 may have a hydrogen ion concentration higher than those of the second wiring insulating pattern 262 and the wiring interface layer 263. The first wiring insulating pattern 261 may have an oxygen concentration higher than that of the second wiring insulating pattern 262. For example, the first wiring insulating pattern 261 may have an oxygen atomic percent higher than those of the second wiring insulating pattern 262 and the wiring interface layer 263.

The first wiring insulating pattern 261 may include silicon oxide or silicon oxynitride, which has a high hydrogen concentration. For example, the first wiring insulating pattern 261 may include a silicon oxide layer formed by providing hydroxide ions (OH") or hydrogen ions (W) into fluorosilicate glass (FSG). For example, the first wiring insulating pattern 261 may include a silicon oxynitride layer which includes hydrogen atoms by a plasma deposition process using $N_2/SiH_4$ gases or $NH_3/SiH_4$ gases. For example, the first wiring insulating pattern 261 may include a silicon oxide layer which includes hydrogen by a plasma deposition process using $N_2O/SiH_4$ gases.

A peripheral upper insulating layer 270 may be provided on the second wiring insulating pattern 262. The peripheral upper insulating layer 270 may cover a top surface of the second wiring insulating pattern 262. The peripheral upper insulating layer 270 may include, e.g., silicon oxide.

Figure 8A:
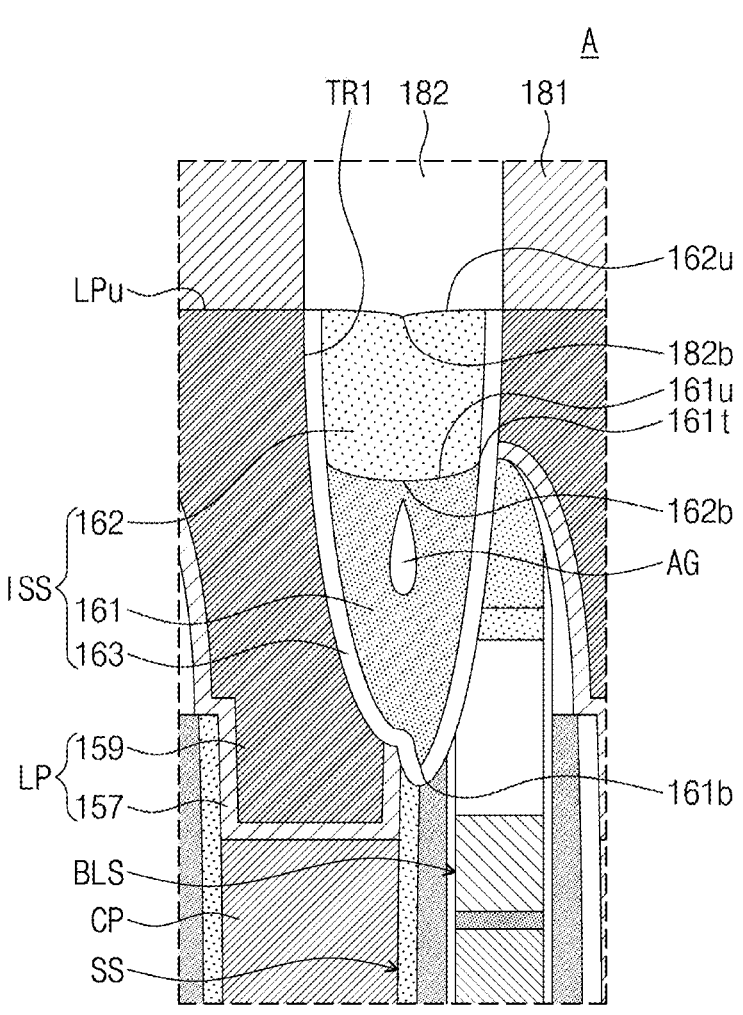
FIGS. 8A and 8B are enlarged cross-sectional views corresponding to portion 'A' of FIG. 3 to illustrate semiconductor devices according to some embodiments.
Figure 8B:
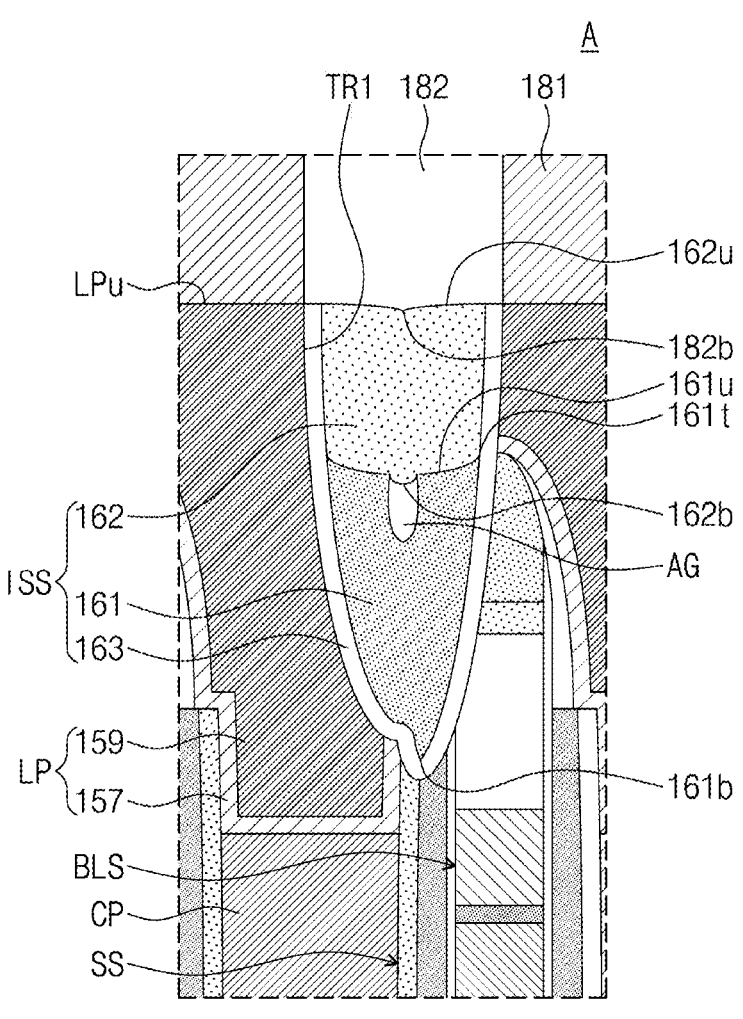

FIGS. 8A and 8B are enlarged cross-sectional views corresponding to portion 'A' of FIG. 3 to illustrate semiconductor devices according to some embodiments. Descriptions of same components as in the above embodiments may be omitted for ease and convenience of explanation.

Referring to FIG. 8A, a first insulating pattern 161 may have an air gap AG. The air gap AG may be disposed under the bottom surface 162b of the second insulating pattern 162. The air gap AG may be defined by an inner surface of the first insulating pattern 161. The air gap AG may include air filling a space surrounded by the inner surface of the first insulating pattern 161. A length of the air gap AG in a horizontal direction may be less than a length of the air gap AG in a vertical direction.

Referring to FIG. 8B, an air gap AG may be defined by an inner surface of the first insulating pattern 161 and a bottom surface of the second insulating pattern 162. A top end of the air gap AG may be closed by the second insulating pattern 162. The second insulating pattern 162 may have the bottom surface 162b protruding toward a bottom of the air gap AG.

FIGS. 9A to 9D are enlarged cross-sectional views corresponding to portion 'B' of FIG. 6 to illustrate semiconductor devices according to some embodiments. Descriptions of same components as in the above embodiments may be omitted for ease and convenience of explanation.

Figure 9A:
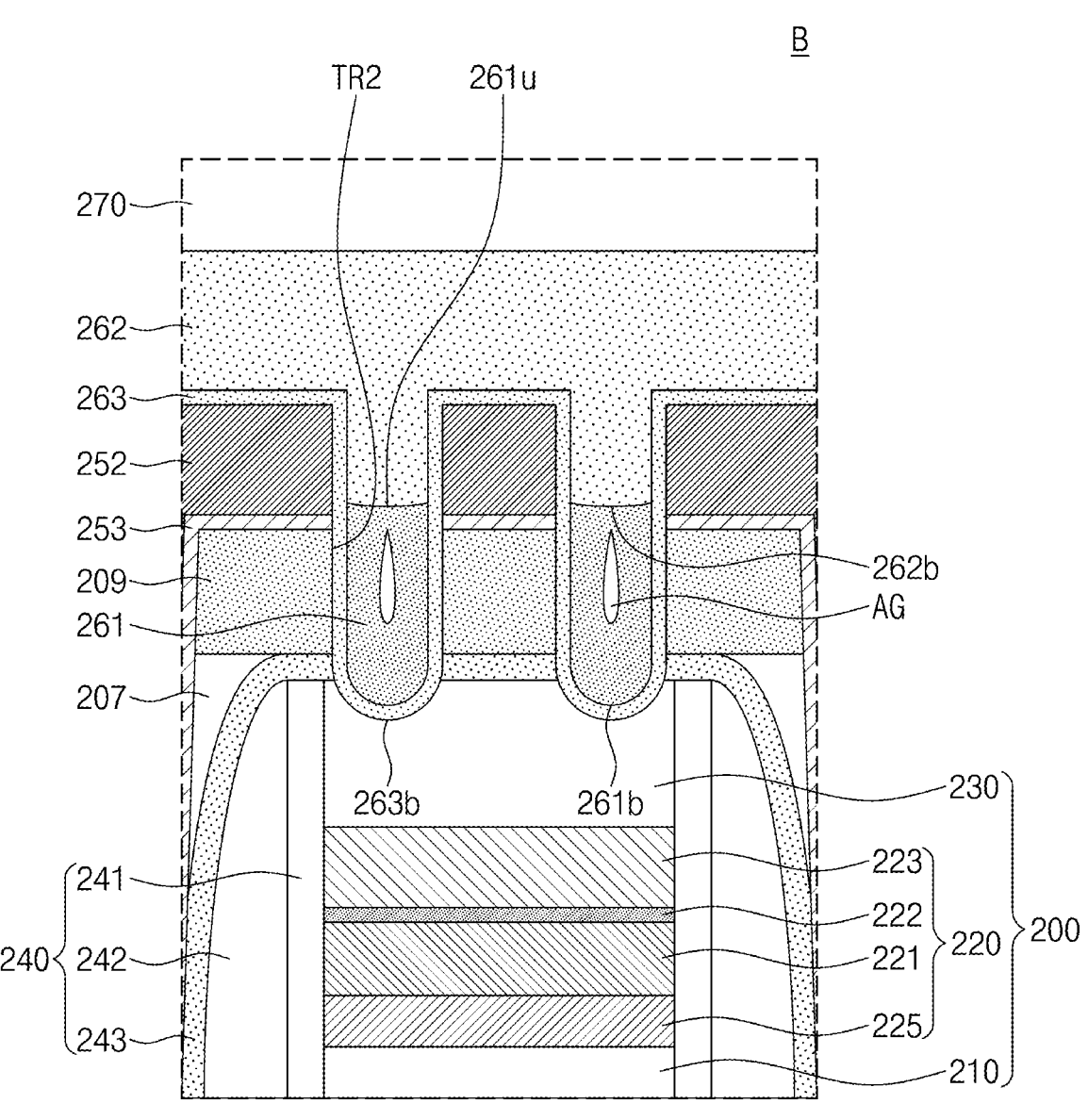
FIGS. 9A to 9D are enlarged cross-sectional views corresponding to portion 'B' of FIG. 6 to illustrate semiconductor devices according to some embodiments.

Referring to FIG. 9A, a first wiring insulating pattern 261 may have an air gap AG. The air gap AG may be disposed under the bottom end 262b of the second wiring insulating pattern 262. The air gap AG may be defined by an inner surface of the first wiring insulating pattern 261. The air gap AG may include air filling a space surrounded by the inner surface of the first wiring insulating pattern 261. The air gap AG in the first wiring insulating pattern 261 may have a length in a horizontal direction, which is less than a length in a vertical direction.

Figure 9B:
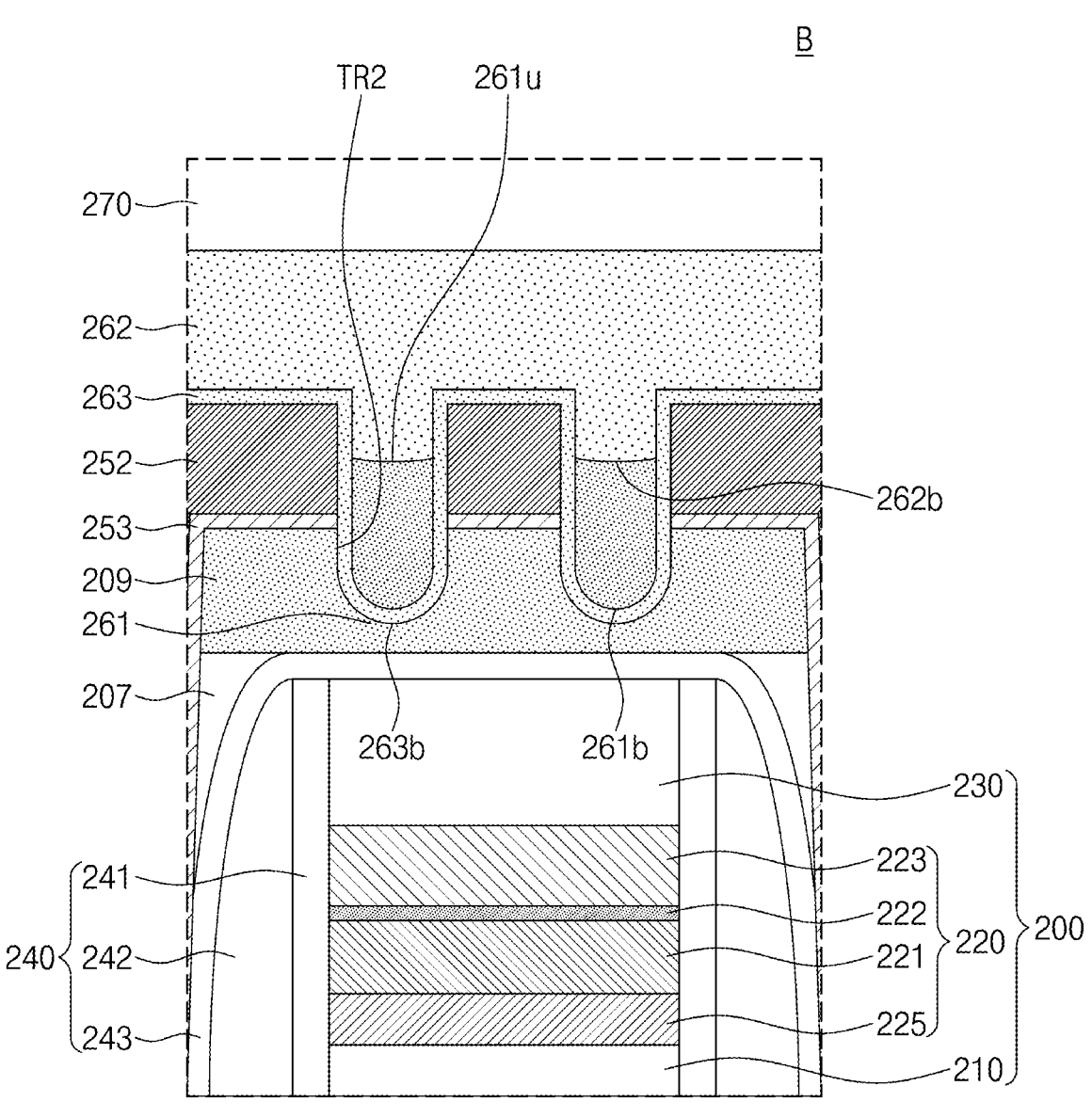

Referring to FIG. 9B, a second trench TR2 may not completely penetrate the second interlayer insulating layer 209. A bottom of the second trench TR2 may be located at a level between the top surface of the second interlayer insulating layer 209 and the bottom surface of the second interlayer insulating layer 209. The bottom end 261b of the first wiring insulating pattern 261 and a bottom end 263b of the wiring interface layer 263 may be higher than the top surface of the gate spacer structure 240.

Figure 9C:
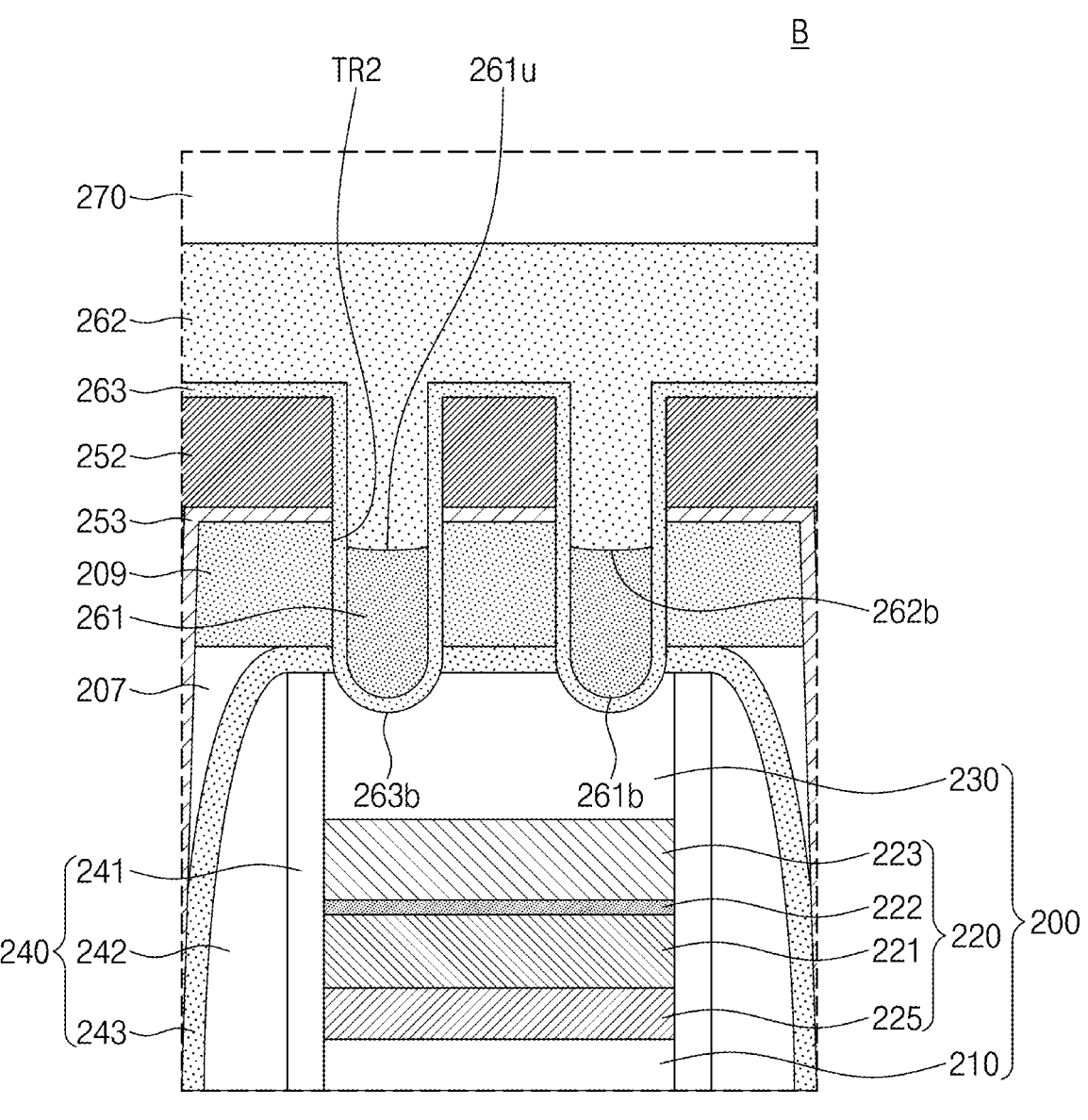

Referring to FIG. 9C, a top surface 261u of the first wiring insulating pattern 261 may be located at a lower level than the bottom surface of the peripheral circuit wiring line 252. A bottom end 262b of the second wiring insulating pattern 262 may be located at a lower level than the bottom surface of the peripheral circuit wiring line 252.

Figure 9D:
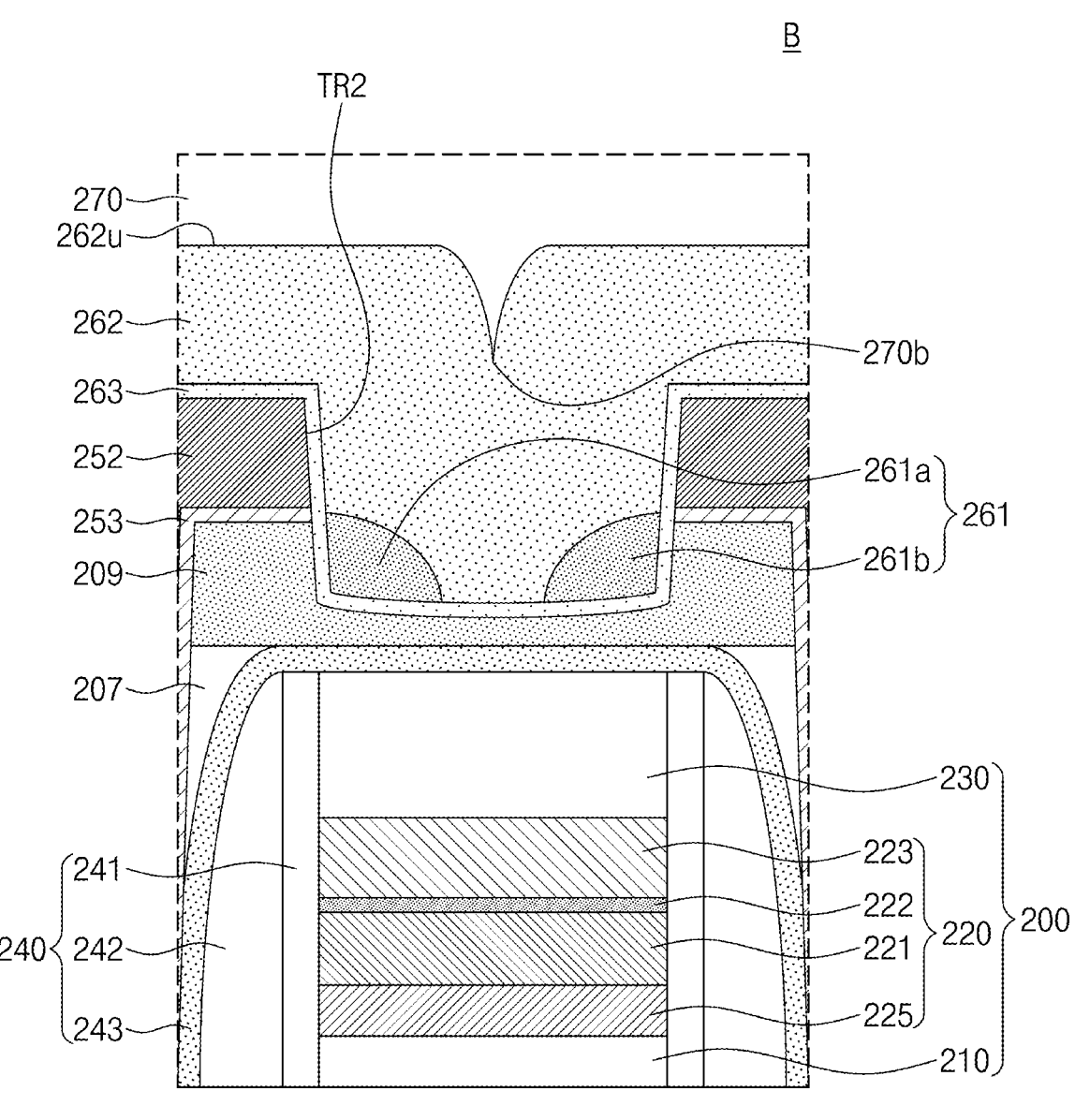

Referring to FIG. 9D, a first wiring insulating pattern 261 may include a first portion 261c and a second portion 261d which are spaced apart from each other in a second trench TR2. Each of the first and second portions 261c and 261d of the first wiring insulating pattern 261 may have a rounded surface and may have a width which decreases as a distance from a bottom surface of the second trench TR2 increases. The first portion 261c and the second portion 261d of the first wiring insulating pattern 261 may be disposed on opposite inner sidewalls of the second trench TR2, respectively. A space between the first and second portions 261c and 261*d* of the first wiring insulating pattern 261 may be filled with the second wiring insulating pattern 262.

Figure 10A:
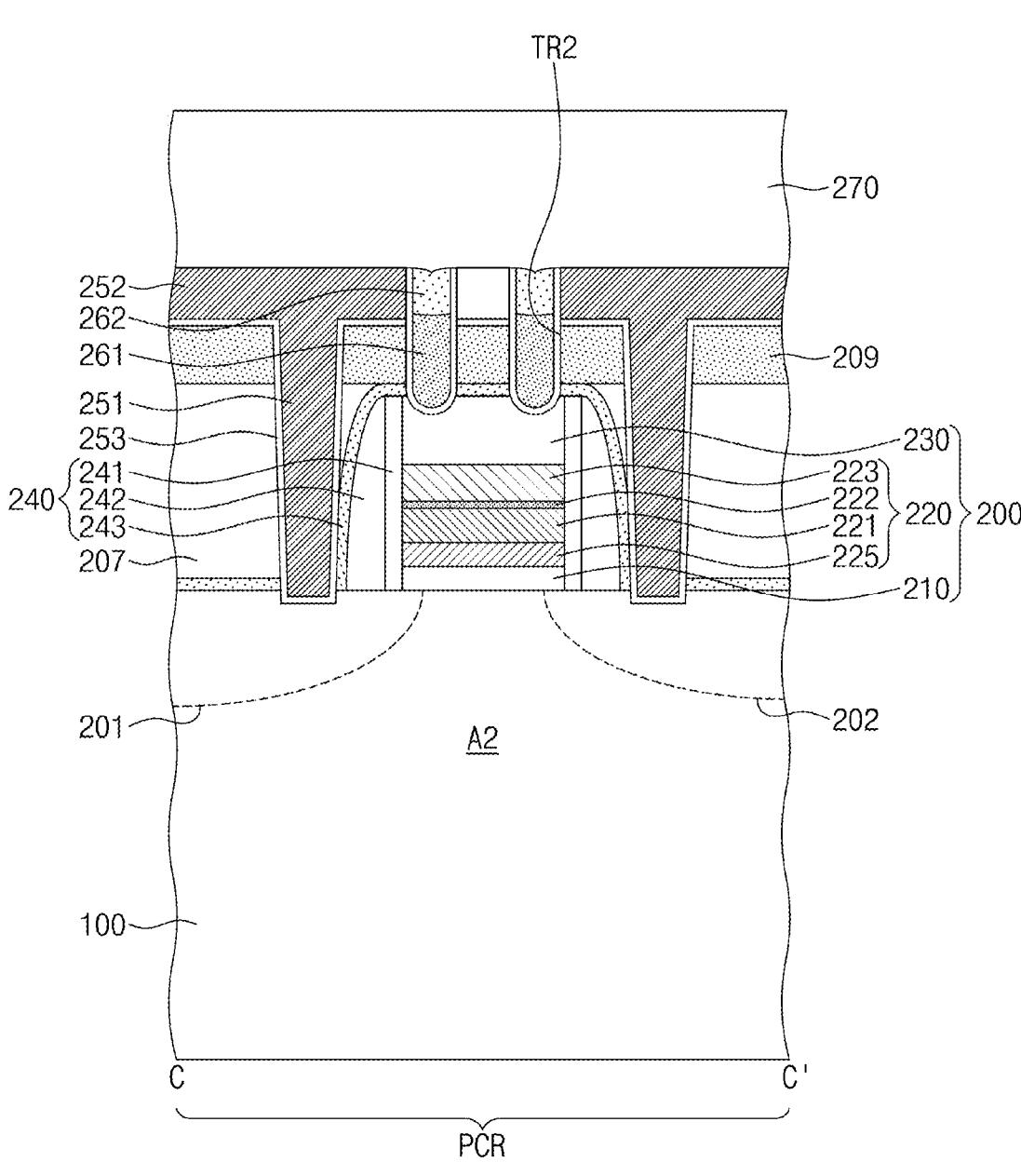
FIGS. 10A and 10B are cross-sectional views corresponding to line C-C' of FIG. 2 to illustrate semiconductor devices according to some embodiments.
Figure 10B:
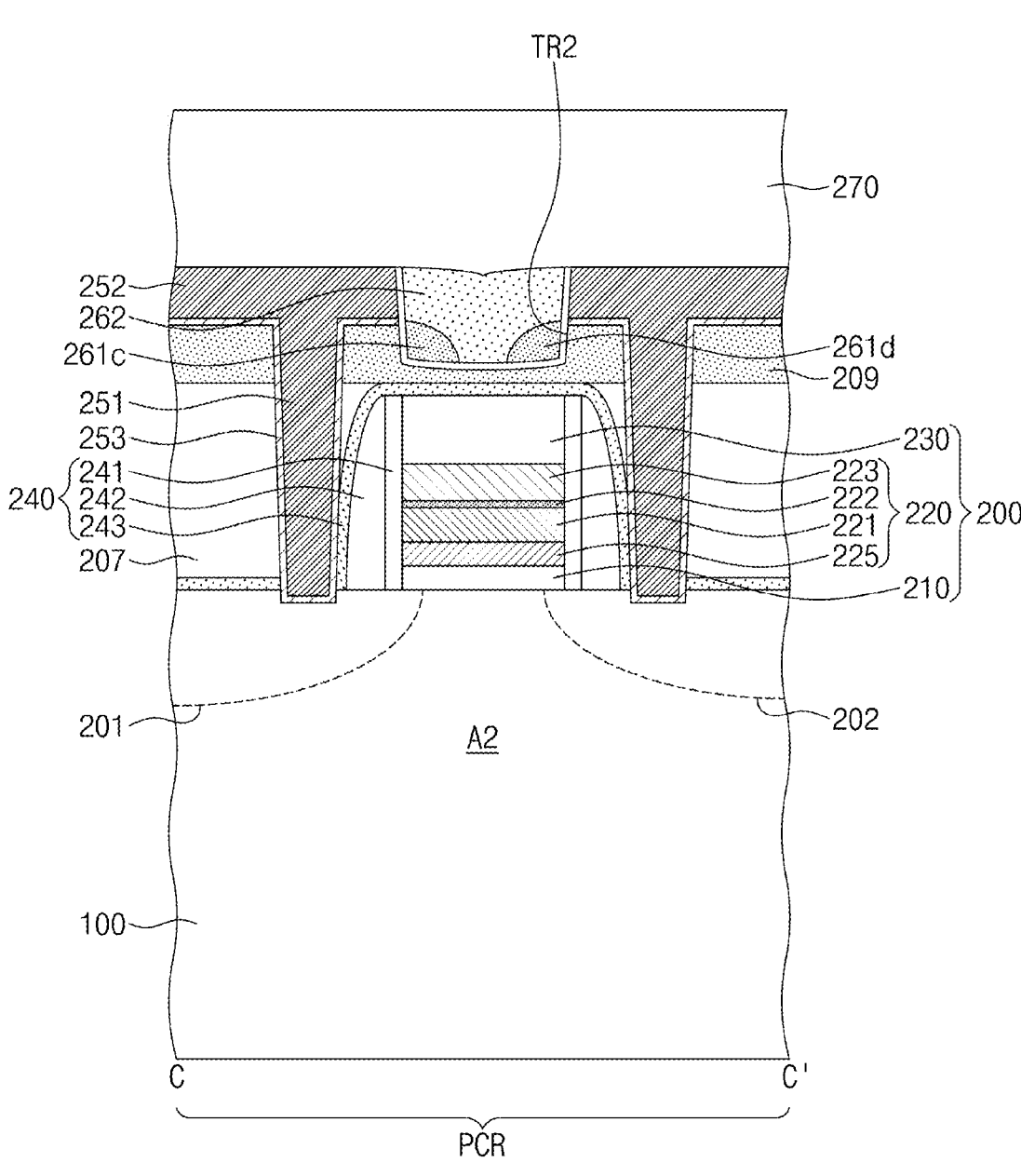

FIGS. 10A and 10B are cross-sectional views corresponding to line C-C' of FIG. 2 to illustrate semiconductor devices according to some embodiments.

Referring to FIGS. 10A and 10B, a second wiring insulating pattern 262 may be locally provided in the second trench TR2. Thus, the second wiring insulating pattern 262 may not be located on the top surfaces of the peripheral circuit wiring lines 252. A top surface of the second wiring insulating pattern 262 may be located at a level which is not higher than the top surfaces of the peripheral circuit wiring lines 252. The peripheral upper insulating layer 270 may be disposed on the top surfaces of the peripheral circuit wiring lines 252. The peripheral upper insulating layer 270 may be in direct contact with the top surfaces of the peripheral circuit wiring lines 252.

Figure 11A:
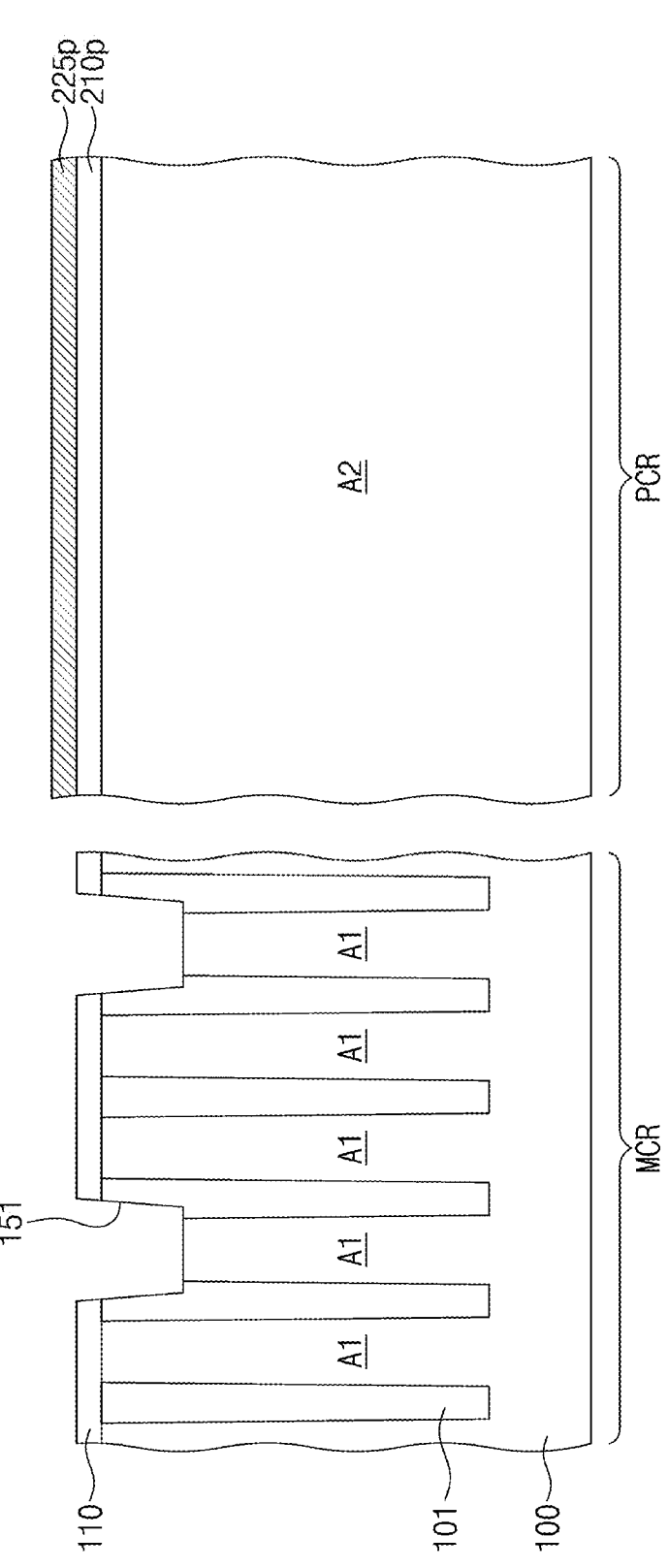
FIGS. 11A to 11P are cross-sectional views corresponding to lines A-A' and C-C' of FIG. 2 to illustrate stages in a method of manufacturing a semiconductor device according to some embodiments.
Figure 11B:
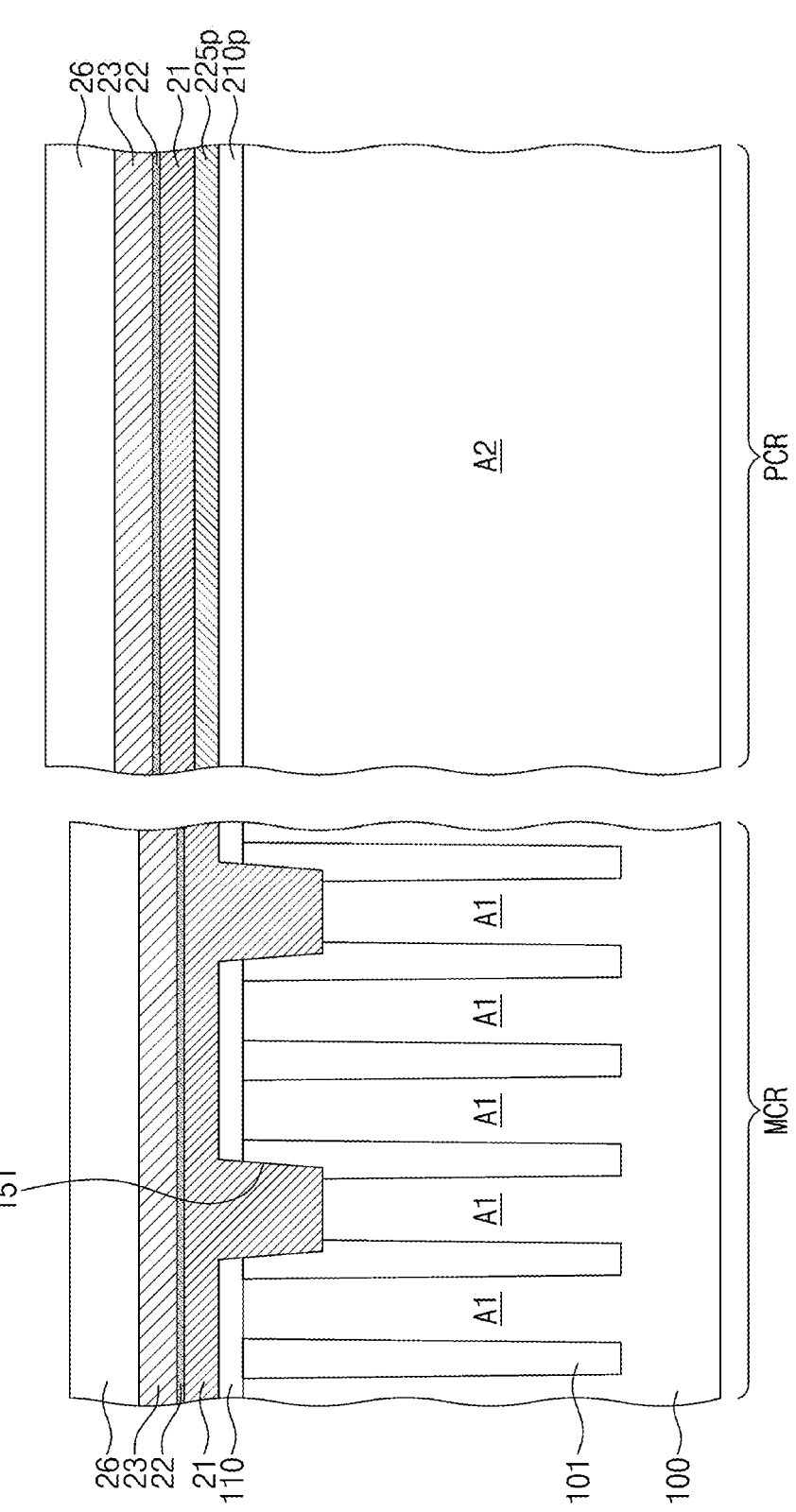
Figure 11C:
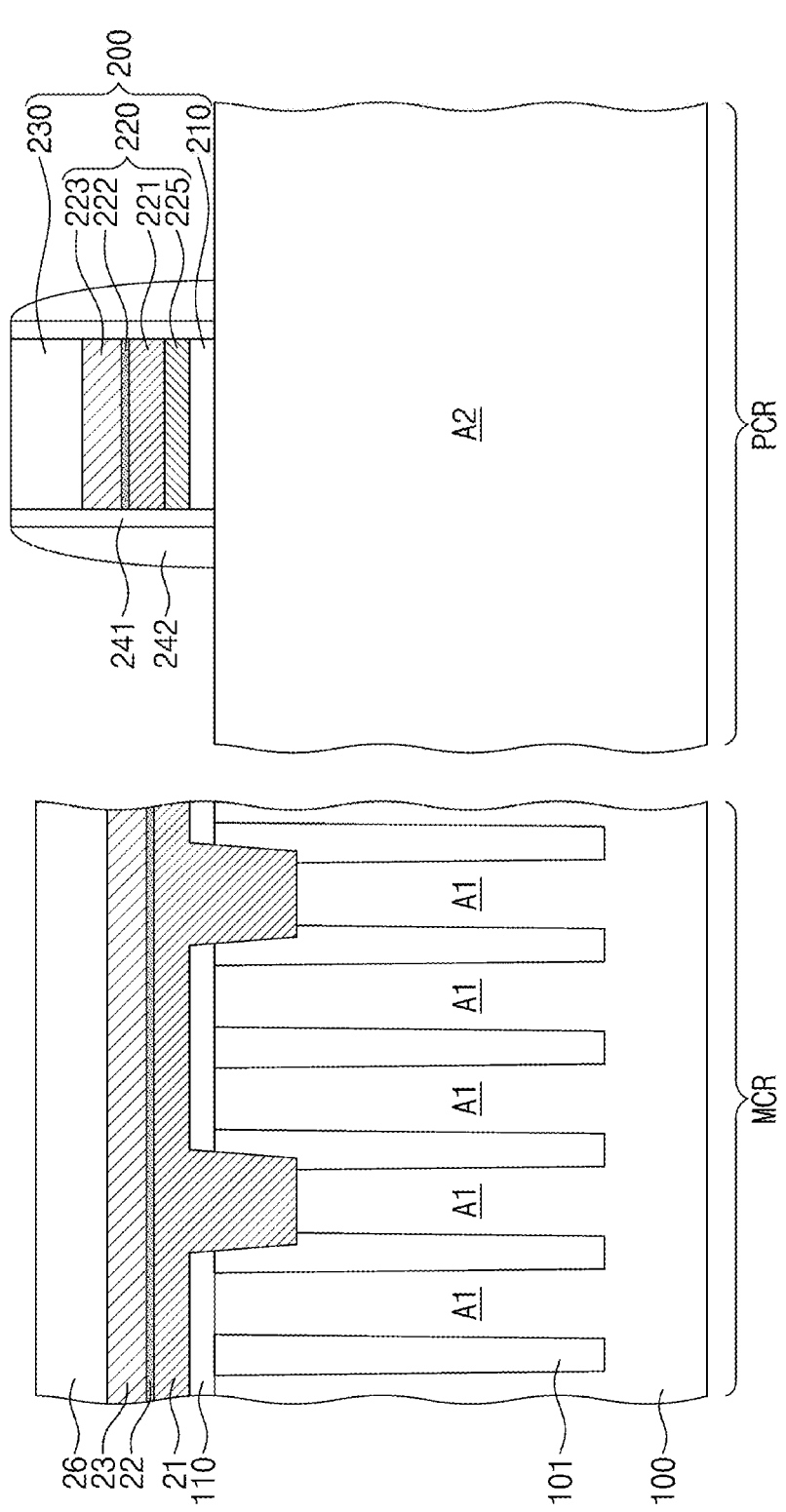
Figure 11D:
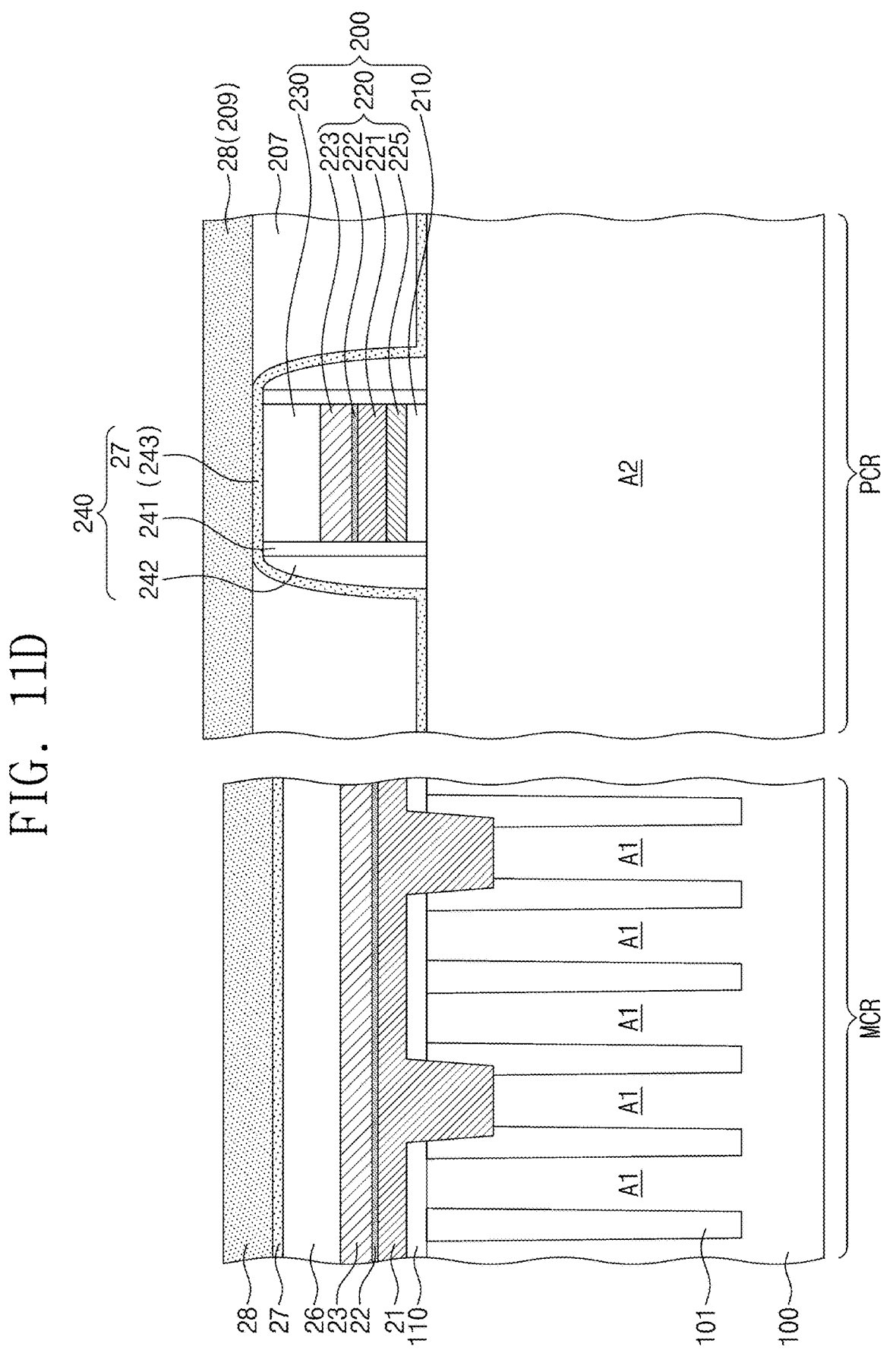
Figure 11E:
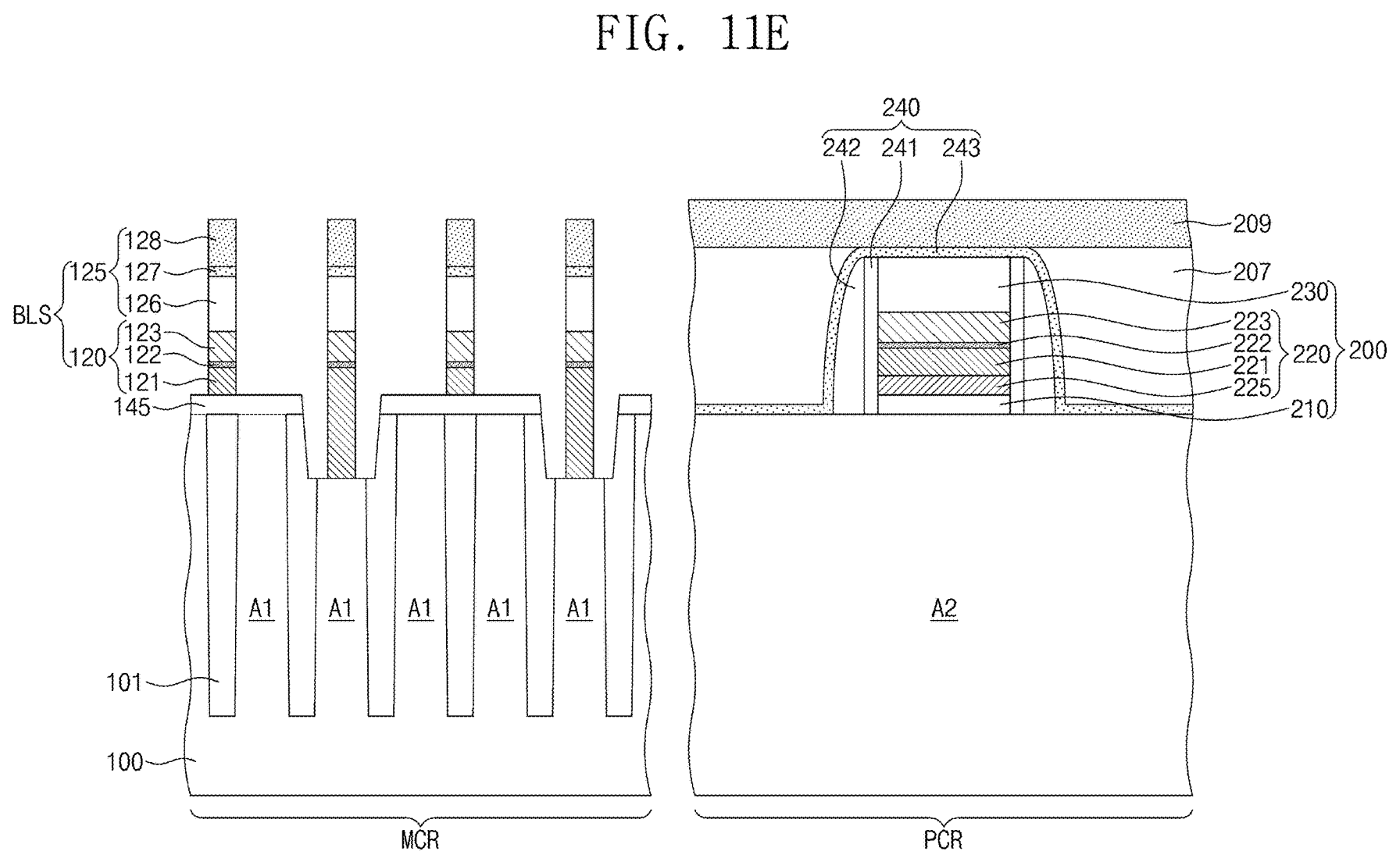
Figure 11F:
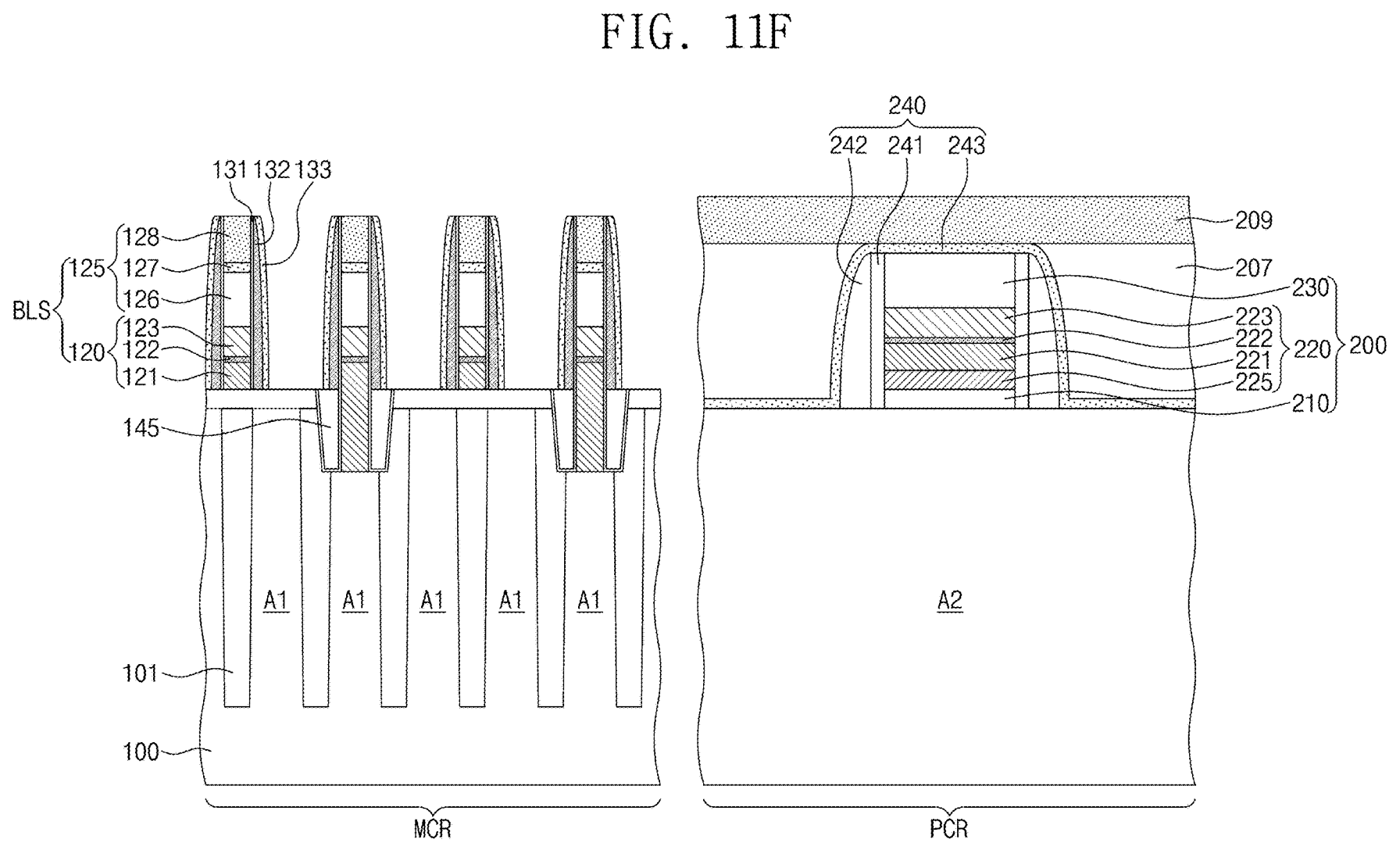
Figure 11G:
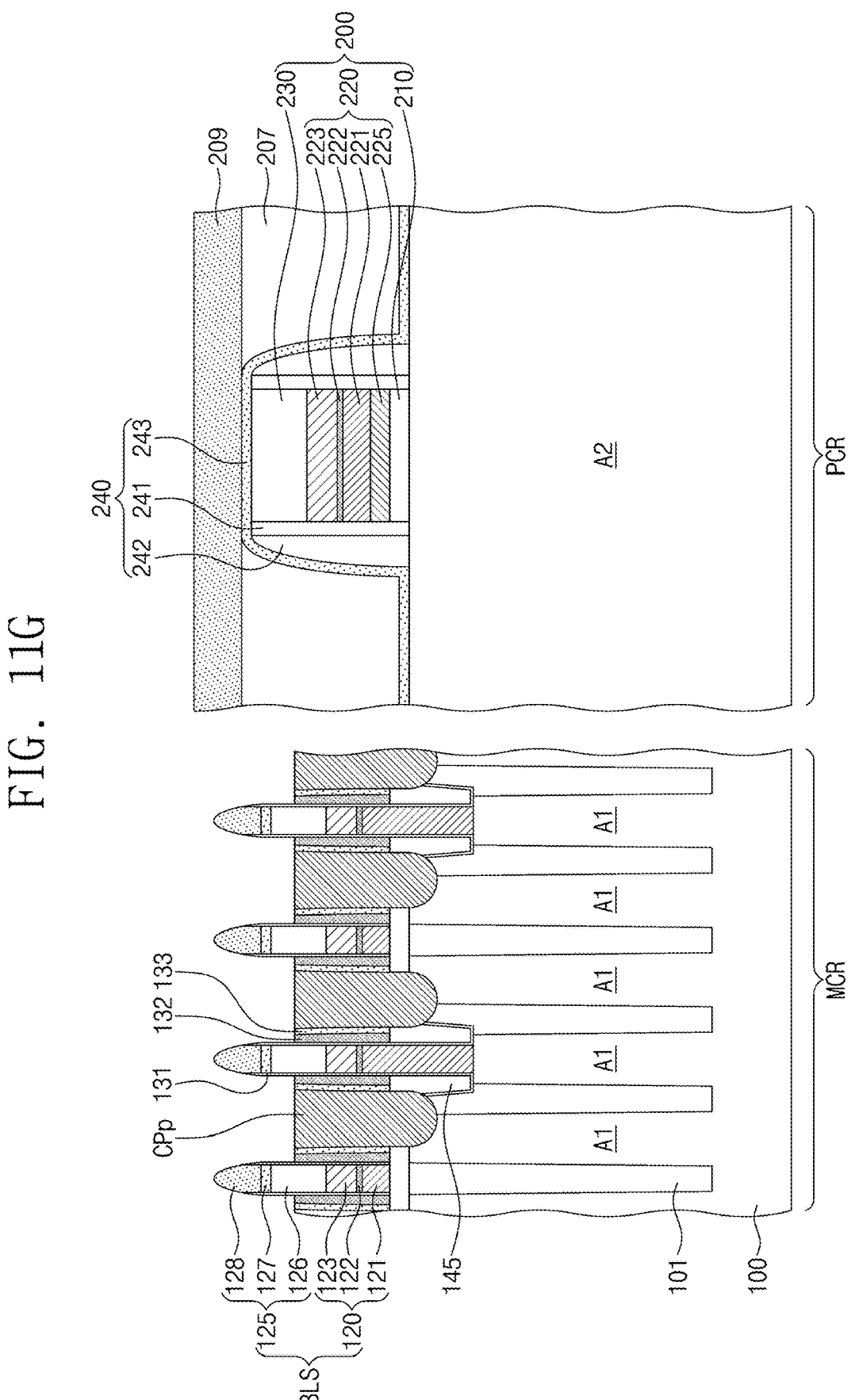
Figure 11H:
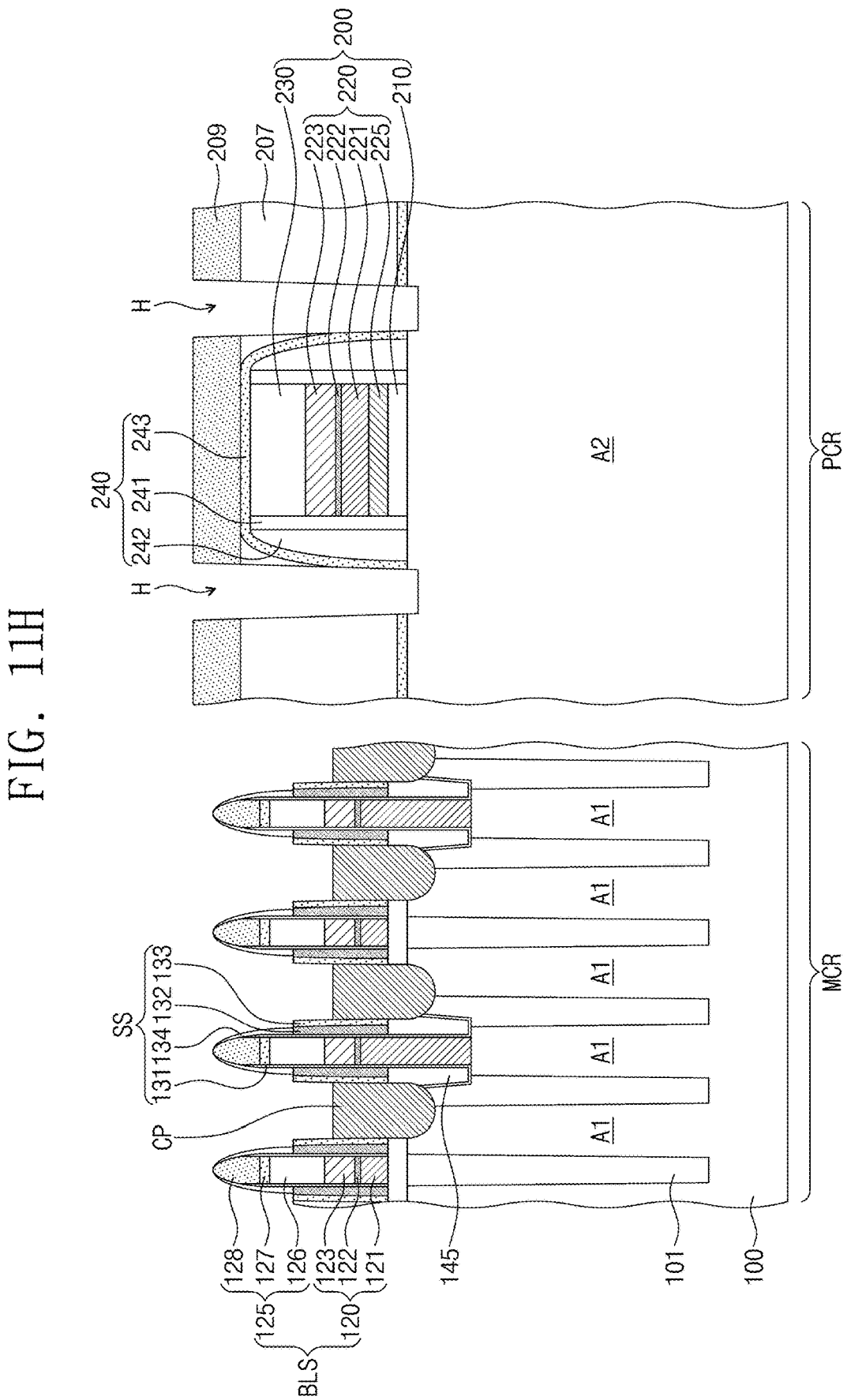
Figure 11I:
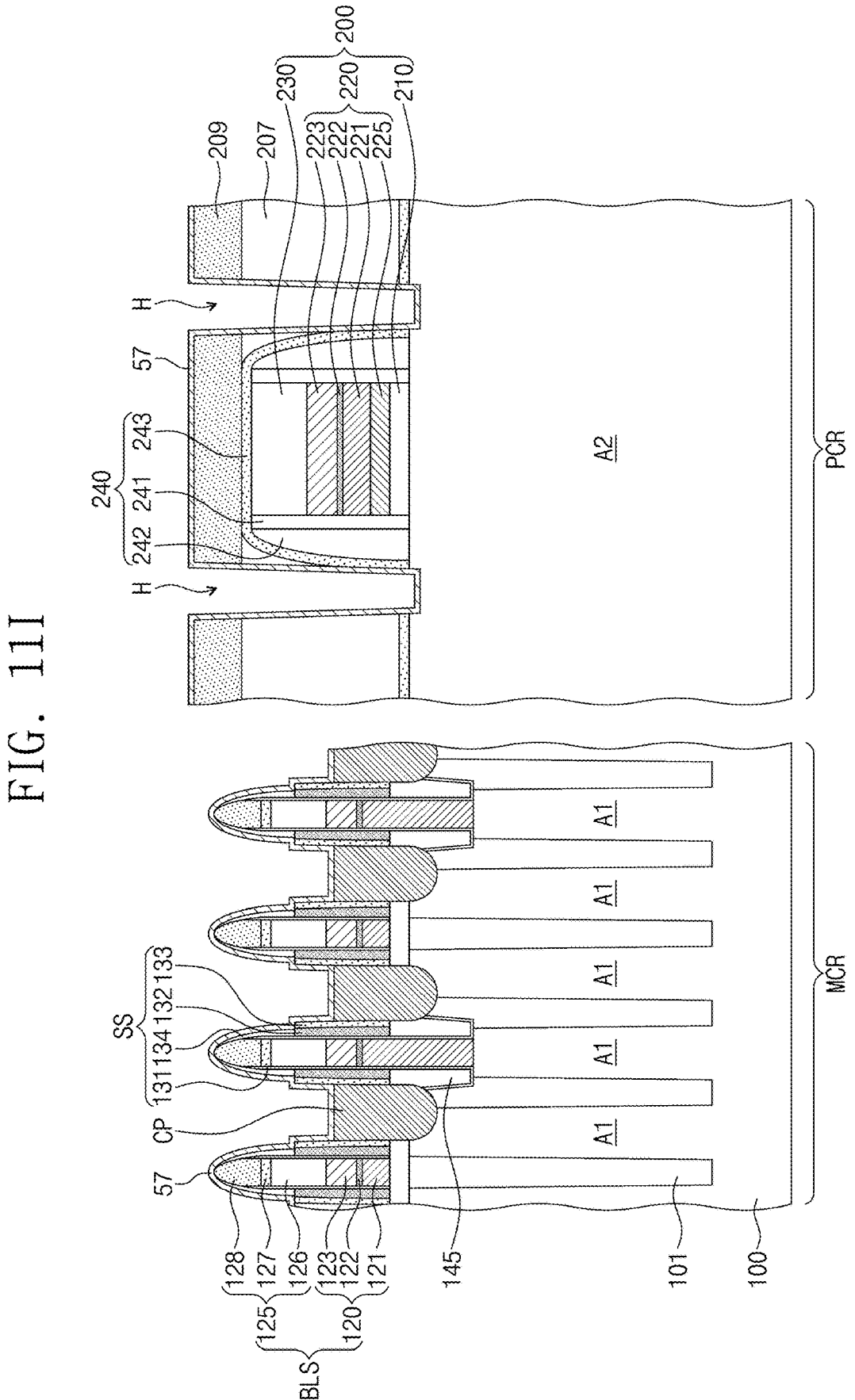
Figure 11J:
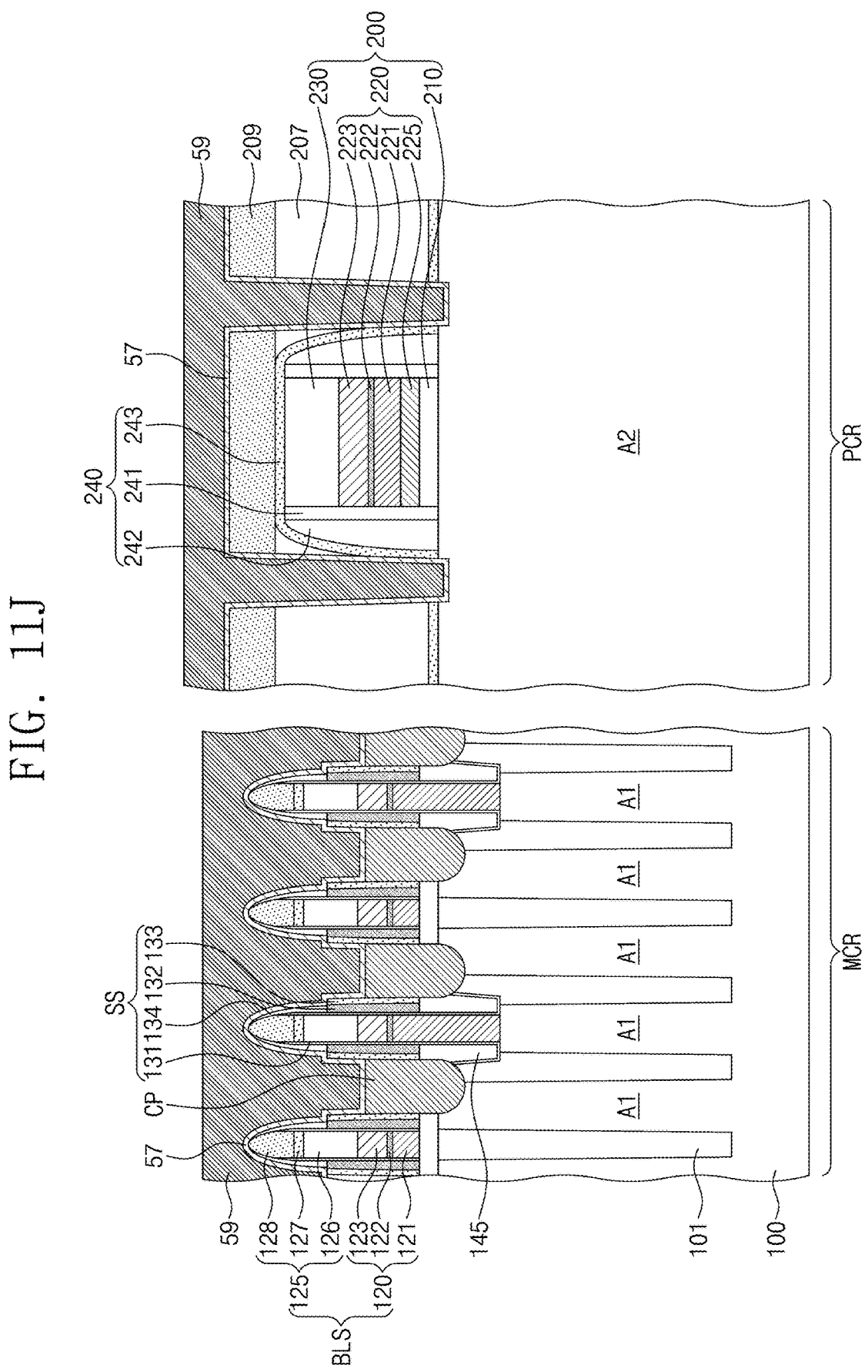
Figure 11K:
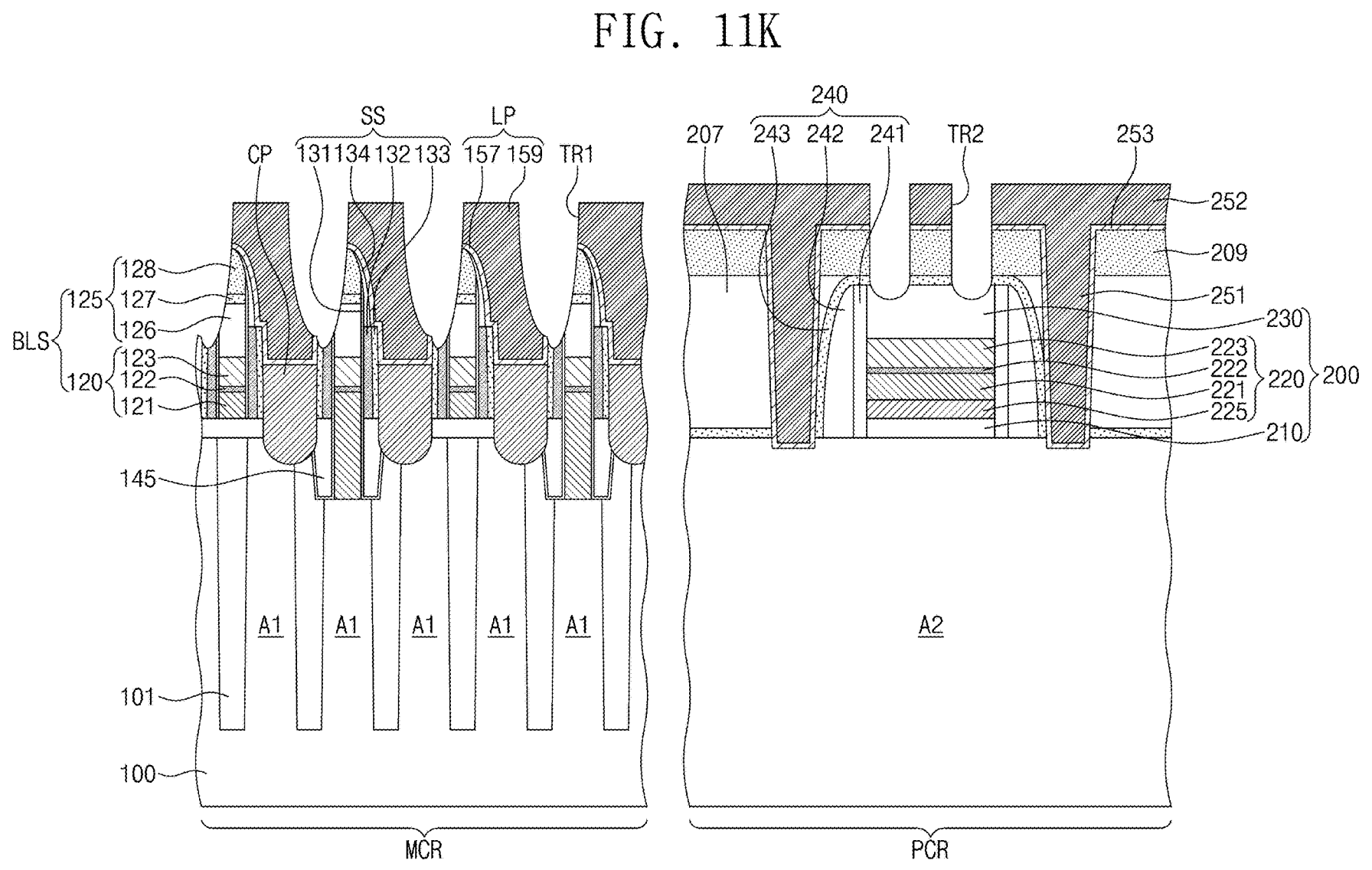
Figure 11L:
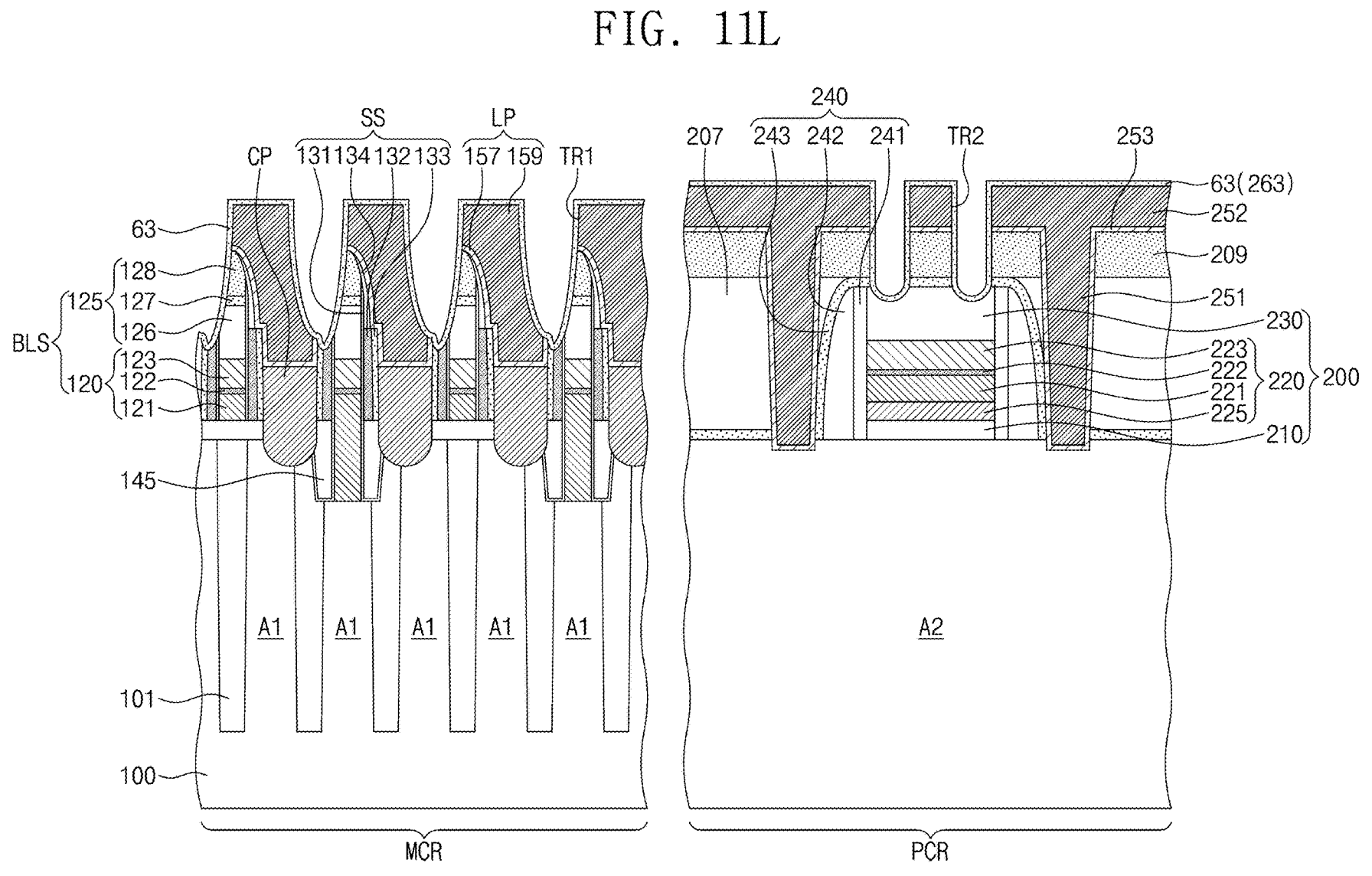
Figure 11M:
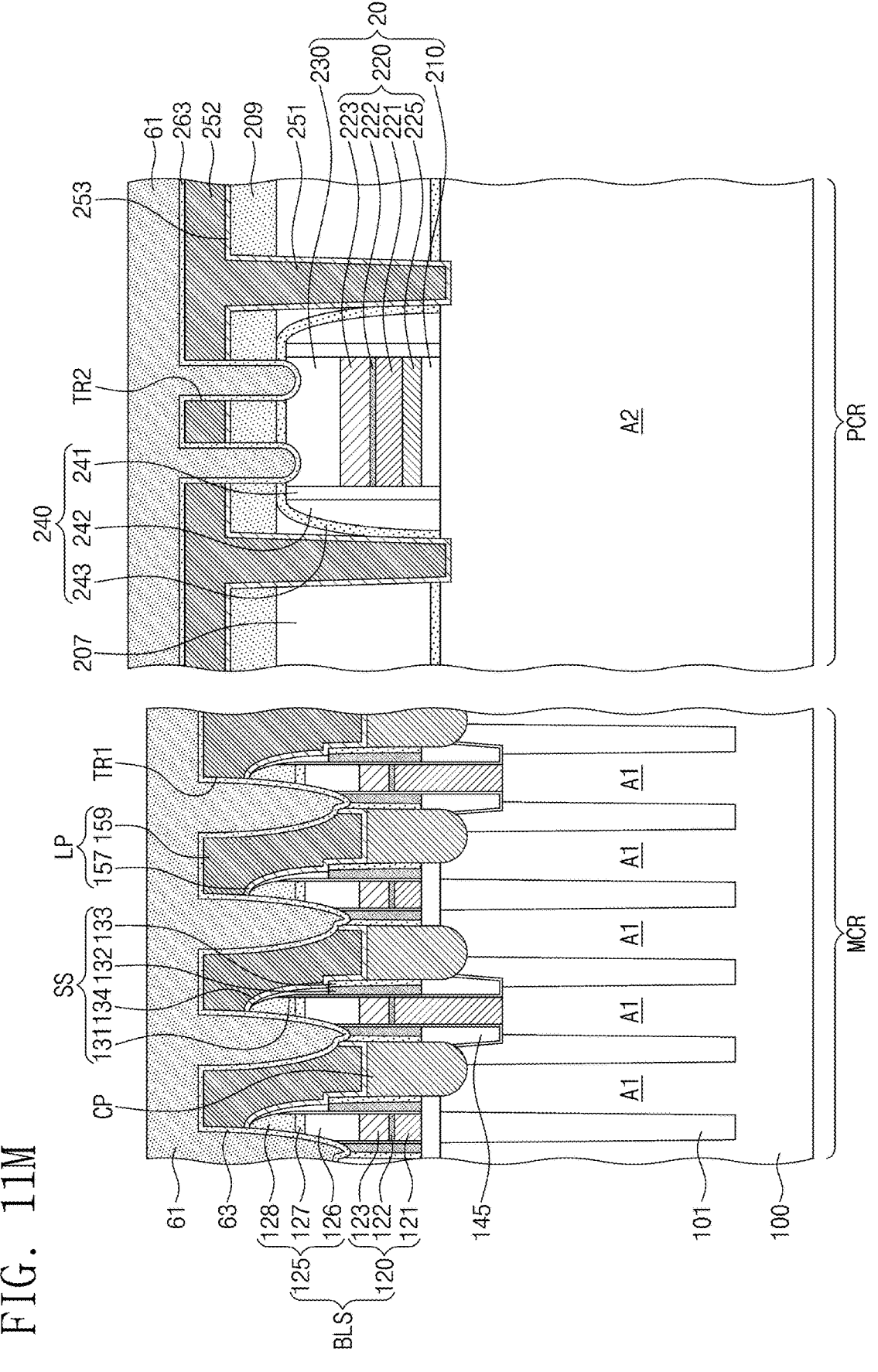
Figure 11N:
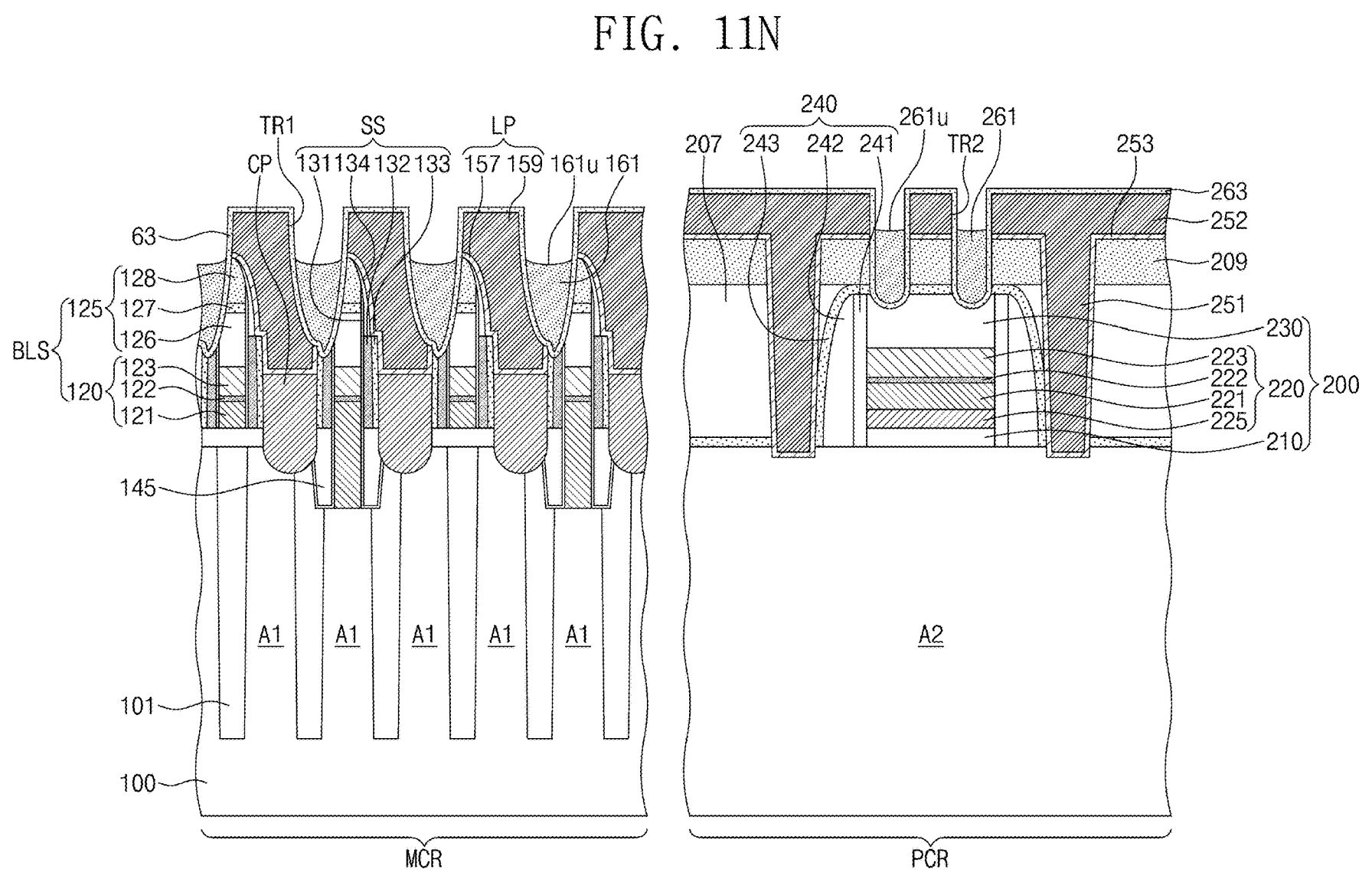
Figure 110:
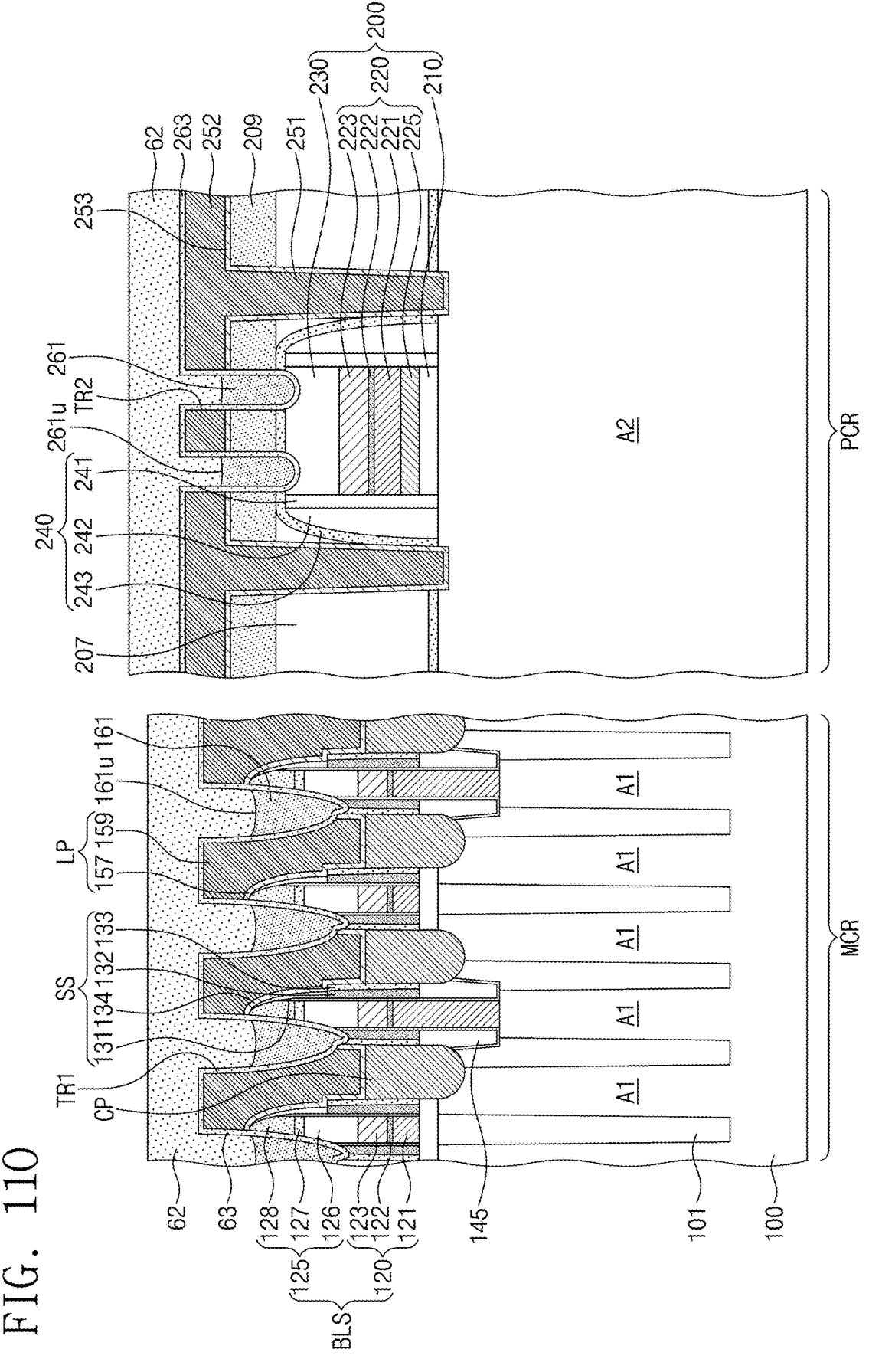
Figure 11P:
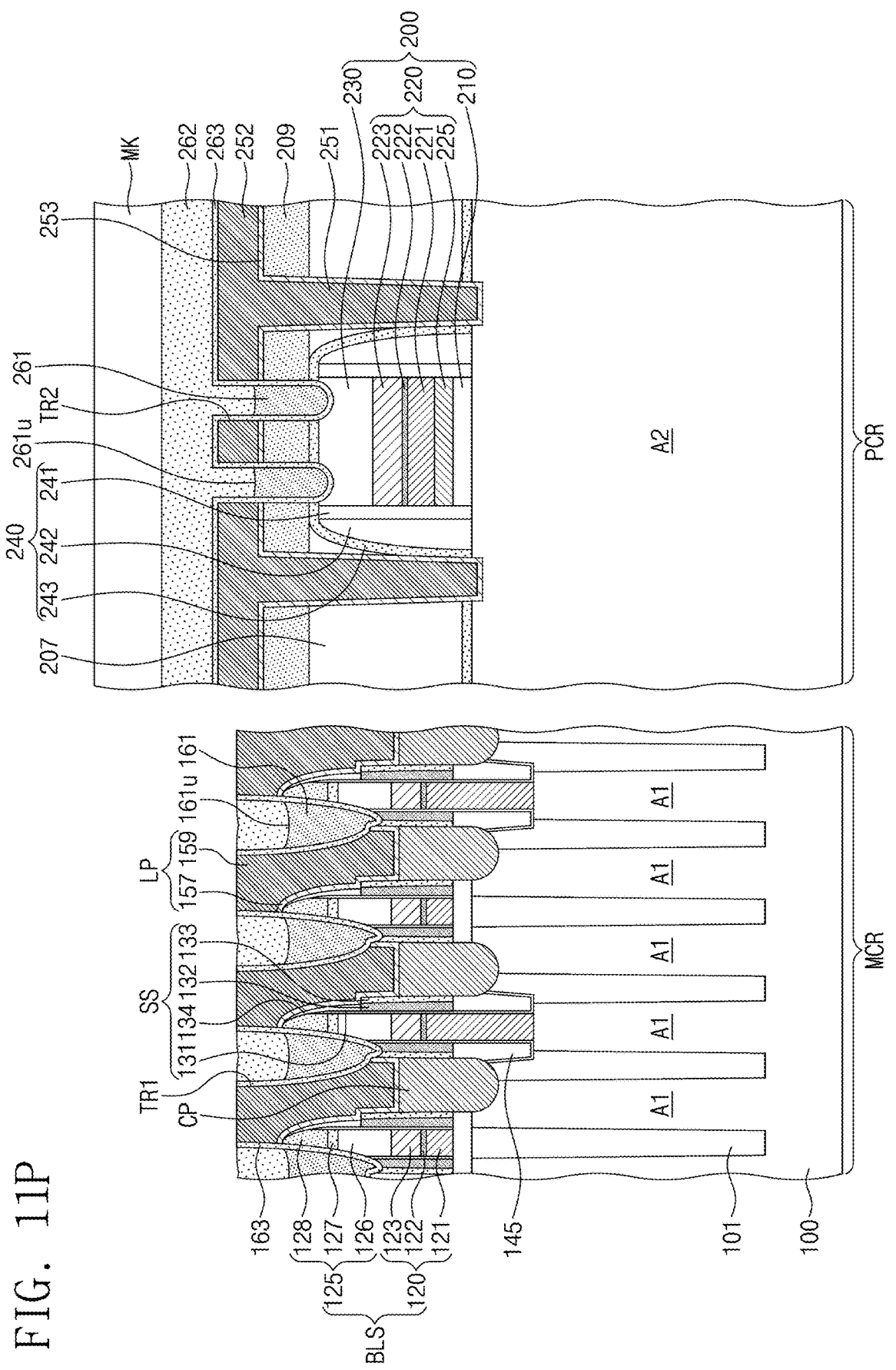

FIGS. 11A to 11P are cross-sectional views corresponding to lines A-A' and C-C' of FIG. 2 to illustrate stages in a method of manufacturing a semiconductor device according to some embodiments.

Referring to FIGS. 2 and 11A, the device isolation layer 101 defining the first active regions A1 may be formed in the substrate 100 of the cell region MCR. A trench may be formed in an upper portion of the substrate 100, and the device isolation layer 101 may be formed by filling the trench with an insulating material. The lower insulating layer 110 may be formed on an entire top surface of the substrate 100 of the cell region MCR. The lower insulating layer 110 may include a single layer or a plurality of insulating layers. For example, the lower insulating layer 110 may include at least one of a silicon oxide layer, a silicon nitride layer, or a silicon oxynitride layer.

The lower insulating layer 110 and the substrate 100 may be patterned to form recess regions 151 exposing the first active regions A1. For example, each of the recess regions 151 may have an elliptical shape when viewed in a plan view. The recess regions 151 may be arranged in a zigzag form or honeycomb form when viewed in a plan view. In an anisotropic etching process for forming the recess regions 151, the first active regions A1 and the device isolation layer 101 may be partially etched. Referring to FIGS. 2, 3 and 11A, gate recess regions 102 may be formed before the formation of the recess regions 151. The gate recess regions 102 may be filled with the gate insulating layer 103, word lines WL and hard mask patterns 105.

Referring again to FIGS. 2 and 11A, a preliminary gate insulating layer 210*p* and a preliminary work function control layer 225*p* may be sequentially formed on an entire top surface of the substrate 100 of the peripheral region PCR. The preliminary gate insulating layer 210*p* and the preliminary work function control layer 225*p* may not be formed on the substrate 100 of the cell region MCR. A first mask pattern may be formed to cover the cell region MCR, and then, deposition processes may be performed on the peripheral region PCR to form the preliminary gate insulating layer 210*p* and the preliminary work function control layer 225*p*.

Referring to FIGS. 2 and 11B, a first preliminary conductive layer 21, a second preliminary conductive layer 22, a third preliminary conductive layer 23, and a first preliminary insulating layer 26 may be sequentially formed on an entire top surface of the substrate 100, e.g., on both the cell region MCR and the peripheral region PCR. The first preliminary conductive layer 21 may include a doped semiconductor material. The first preliminary conductive layer 21 may include, e.g., poly-silicon. The third preliminary conductive layer 23 may include a metal, e.g., at least one of W, Ti, or Ta. Each of the first and third preliminary conductive layers 21 and 23 may be formed by an atomic layer deposition (ALD) process or a physical vapor deposition (PVD) process. The second preliminary conductive layer 22 may include a silicide and may be formed by reacting a top surface of the first preliminary conductive layer 21 with a bottom surface of the third preliminary conductive layer 23. The first preliminary insulating layer 26 may include, e.g., silicon nitride, and may be formed using an ALD process, a chemical vapor deposition (CVD) process, or a PVD process.

Referring to FIGS. 2 and 11C, a patterning process may be performed on the peripheral region PCR to form the gate stack 200. For example, a second mask pattern may be formed on the cell region MCR and the peripheral region PCR. The second mask pattern may completely cover the cell region MCR and may partially cover the peripheral region PCR. Next, an etching process may be performed using the second mask pattern as an etch mask. The layers stacked on the substrate 100 of the peripheral region PCR may be etched to form the gate stack 200. Referring to FIGS. 11B and 11C, the preliminary gate insulating layer 210*p*, the preliminary work function control layer 225*p*, the first preliminary conductive layer 21, the second preliminary conductive layer 22, the third preliminary conductive layer 23, and the first preliminary insulating layer 26 on the peripheral region PCR may be formed into the gate insulating layer 210, the work function control layer 225, the first conductive layer 221, the second conductive layer 222, the third conductive layer 223, and the gate capping pattern 230, respectively, by the etching process.

Next, the first gate spacer 241 and the second gate spacer 242 may be formed on a sidewall of the gate stack 200. The formation of the first gate spacer 241 and the second gate spacer 242 may include forming a first preliminary spacer layer and a second preliminary spacer layer which cover the gate stack 200, and performing a patterning process on the first preliminary spacer layer and the second preliminary spacer layer. The patterning process may include anisotropically etching the first and second preliminary spacer layers until a top surface of the gate capping pattern 230 is exposed.

Referring to FIGS. 2 and 11D, a second preliminary insulating layer 27 may be formed on an entire top surface of the substrate 100 by a deposition process. On the cell region MCR, the second preliminary insulating layer 27 may be formed on a top surface of the first preliminary insulating layer 26. On the peripheral region PCR, the second preliminary insulating layer 27 may be formed on the top surface of the substrate 100. The second preliminary insulating layer 27 on the peripheral region PCR may correspond to a third gate spacer 243 conformally covering the gate stack 200, the first gate spacer 241, and the second gate spacer 242. Next, a first interlayer insulating layer 207 covering the third gate spacer 243 may be formed by performing a deposition process on the peripheral region PCR. The first interlayer insulating layer 207 may be formed to have a top surface located at substantially the same level as a top surface of the third gate spacer 243.

Subsequently, a third preliminary insulating layer 28 may be formed by performing a deposition process on an entire top surface of the substrate 100. On the cell region MCR, the third preliminary insulating layer 28 may be formed on a top surface of the second preliminary insulating layer 27. On the peripheral region PCR, the third preliminary insulating layer 28 may be formed on the top surface of the first interlayer insulating layer 207 and the top surface of the third gate spacer 243. The third preliminary insulating layer 28 on the peripheral region PCR may correspond to a second interlayer insulating layer 209 on the peripheral region PCR.

Referring to FIGS. 2 and 11E, a patterning process may be performed on the substrate 100 of the cell region MCR to form bit line structures BLS. The formation of the bit line structures BLS may include forming a third mask pattern on an entire top surface of the substrate 100, and performing an etching process using the third mask pattern as an etch mask. The third mask pattern may completely cover the peripheral region PCR. The layers on the substrate 100 of the cell region MCR, which are exposed by the third mask pattern, may be etched to form the bit line structures BLS.

Referring to FIGS. 2 and 11F, the first spacer 131, the second spacer 132, and the third spacer 133 may be sequentially formed on a sidewall of the bit line structure BLS. Before the formation of the second spacer 132 and the third spacer 133, het bit line contact spacer 145 may be formed on a lower sidewall of the bit line structure BLS.

Referring to FIGS. 2 and 11G, preliminary lower contacts CPp may be formed between sidewalls of the bit line structures BLS. Next, an etching process may be performed to partially remove upper portions of the first spacer 131, the second spacer 132, and the third spacer 133. The etching process may be performed until top surfaces of the second and third spacers 132 and 133 are located at a similar level to top surfaces of the preliminary lower contacts CPp.

Referring to FIGS. 2 and 11H, the fourth spacer 134 may be formed to cover an upper sidewall of the first spacer 131. Subsequently, the lower contacts CP may be formed by removing upper portions of the preliminary lower contacts CPp. Top surfaces of the lower contacts CP may be located at a lower level than the top surface of the second spacer 132 and the top surface of the third spacer 133.

Next, contact holes H vertically penetrating the first and second interlayer insulating layers 207 and 209 may be formed on the substrate 100 of the peripheral region PCR. An upper portion of the substrate 100 may be partially removed when the contact holes H are formed. Bottoms of the contact holes H may be located at a lower level than the top surface of the substrate 100.

Referring to FIGS. 2 and 11I, a preliminary barrier layer 57 may be formed by performing a deposition process on an entire top surface of the substrate 100. The preliminary barrier layer 57 may cover the top surfaces of the lower contacts CP, sidewalls of the spacer structures SS, and top surfaces of the bit line structures BLS on the cell region MCR. The preliminary barrier layer 57 may cover a top surface of the second interlayer insulating layer 209 and inner surfaces of the contact holes H on the peripheral region PCR.

Referring to FIGS. 2 and 11J, a preliminary metal layer 59 may be formed on the preliminary barrier layer 57. On the cell region MCR, the preliminary metal layer 59 may fill spaces between the spacer structures SS and may extend onto the top surfaces of the bit line structures BLS. On the peripheral region PCR, the preliminary metal layer 59 may be disposed on the top surface of the second interlayer insulating layer 209 and may fill remaining portions of the contact holes H.

Referring to FIGS. 2 and 11K, a patterning process may be performed on an entire top surface of the substrate 100 to form a first trench TR1 and second trenches TR2. The formation of the first trench TR1 and the second trenches TR2 may include forming a fourth mask pattern on the substrate 100, and performing an etching process using the fourth mask pattern as an etch mask. Landing pads LP may be formed on the cell region MCR by the formation of the first trench TR1 in the cell region MCR. The landing pads LP may be physically separated from each other by the first trench TR1. For example, the first trench TR1 may be continuous in the entire cell region MCR, so portions of the first trench TR1 separating the landing pads LP from each other (e.g., portions of the first trench TR1 between the landing pads LP illustrated in the FIG. 11K) may be continuous and in fluid communication with each other to define a single first trench TR1. Peripheral contacts 251 and peripheral circuit wiring lines 252 may be formed on the peripheral region PCR by the formation of the second trenches TR2. The peripheral circuit wiring lines 252 may be wiring patterns which have sidewalls facing each other with the second trenches TR2 interposed therebetween.

Referring to FIGS. 2 and 11L, a preliminary interface layer 63 may be formed by performing a deposition process on an entire top surface of the substrate 100. On the cell region MCR, the preliminary interface layer 63 may be formed to conformally, e.g., and continuously, cover top surfaces of pad metal patterns 159 of the landing pads LP and an inner surface of the first trench TR1. On the peripheral region PCR, the preliminary interface layer 63 may be formed to conformally cover top surfaces of the peripheral circuit wiring lines 252 and inner surfaces of the second trenches TR2. The preliminary interface layer 63 may include silicon nitride. The preliminary interface layer 63 may be deposited to have a thickness of about 5 nm to about 20 nm. The preliminary interface layer 63 may form a wiring interface layer 263 on the peripheral region PCR.

Referring to FIGS. 2 and 11M, a first preliminary insulating pattern 61 may be formed by performing a deposition process, e.g., ALD, on an entire top surface of the substrate 100. The first preliminary insulating pattern 61 may fill remaining portions of the first trench TR1 and the second trenches TR2. The first preliminary insulating pattern 61 may be spaced apart, e.g., completely separated, from the inner surface of the first trench TR1 and the inner surfaces of the second trenches TR2 by the preliminary interface layer 63. The first preliminary insulating pattern 61 may include silicon oxide or silicon oxynitride, which has a high hydrogen concentration. In some embodiments, the first preliminary insulating pattern 61 may be formed by providing hydroxide ions ($OH^-$) or hydrogen ions ($H^+$) into fluorosilicate glass (FSG). In certain embodiments, the first preliminary insulating pattern 61 may include hydrogen atoms by performing a plasma deposition process using $N_2/SiH_4$ gases or $NH_3/SiH_4$ gases. In certain embodiments, the first preliminary insulating pattern 61 may include hydrogen atoms by performing a plasma deposition process using $N_2O/SiH_4$ gases.

Referring to FIGS. 2 and 11N, the first preliminary insulating pattern 61 may be partially removed to form the first insulating pattern 161 and the first wiring insulating pattern 261. The partial removal of the first preliminary insulating pattern 61 may be performed using an etch-back process, e.g., selectively etching an oxide (relative to a nitride) via wet etching, so upper portions of the first trench TR1 and second trenches TR2 above the first insulating pattern 161 and the first wiring insulating pattern 261 may be exposed. The first insulating pattern 161 may have a top surface 161*u* located at a lower level than the top surface of the pad metal pattern 159, e.g., a distance from the top surface 161*u* to the bottom of the substrate 100 may be smaller than a distance from the top surface of the pad metal pattern 159 to the bottom of the substrate 100. The first wiring insulating pattern 261 may have a top surface 261*u* located at a lower level than the top surface of the peripheral circuit wiring line 252, e.g., a distance from the top surface 261$u$ to the bottom of the substrate 100 may be smaller than a distance from the top surface of the peripheral circuit wiring line 252 to the bottom of the substrate 100.

Referring to FIGS. 2 and 11O, a second preliminary insulating pattern 62 may be formed by performing a deposition process on an entire top surface of the substrate 100, e.g., so the second preliminary insulating pattern 62 may completely fill the exposed upper portions of the first trench TR1 and second trenches TR2 above the first insulating pattern 161 and the first wiring insulating pattern 261. The second preliminary insulating pattern 62 may be formed to have an oxygen concentration lower than that of the first preliminary insulating pattern 61 described with reference to FIG. 11M. The second preliminary insulating pattern 62 may include, e.g., silicon nitride.

Referring to FIGS. 2 and 11P, the second preliminary insulating pattern 62 on the cell region MCR may be partially removed. The partial removal of the second preliminary insulating pattern 62 may be performed using an etching process, and the peripheral region PCR may be covered by a cell open mask MK during the etching process. The cell open mask MK may completely cover the peripheral region PCR and may completely expose the cell region MCR. The top surfaces of the pad metal patterns 159 may be exposed by the etching process. The etching process may be performed until top surfaces of the second insulating pattern 162 and the interface layer 163 are located at a level which is not higher than the top surface of the pad metal pattern 159. The cell open mask MK may be removed after the etching process. For example, as illustrated in FIG. 11P, the second insulating pattern 162 may, e.g., completely, separate between adjacent landing pads LP.

Referring again to FIGS. 2, 3 and 6, the upper electrodes 181 and the cell upper insulating layer 182 may be formed on the cell region MCR. The peripheral upper insulating layer 270 may be formed on the peripheral region PCR. For example, a deposition process may be performed on an entire top surface of the substrate 100 to form the cell upper insulating layer 182 and the peripheral upper insulating layer 270. The cell upper insulating layer 182 may be patterned to expose top surfaces of the landing pads LP, and then, the upper electrodes 181 may be formed on the top surfaces of the landing pads LP.

FIGS. 12A to 12F are cross-sectional views corresponding to lines A-A' and C-C' of FIG. 2 to illustrate stages in a method of manufacturing a semiconductor device according to some embodiments. A manufacturing method according to the present embodiments may include the processes described with reference to FIGS. 11A to 11J. Descriptions of same components as in the above embodiments may be omitted for ease and convenience of explanation.

Figure 12A:
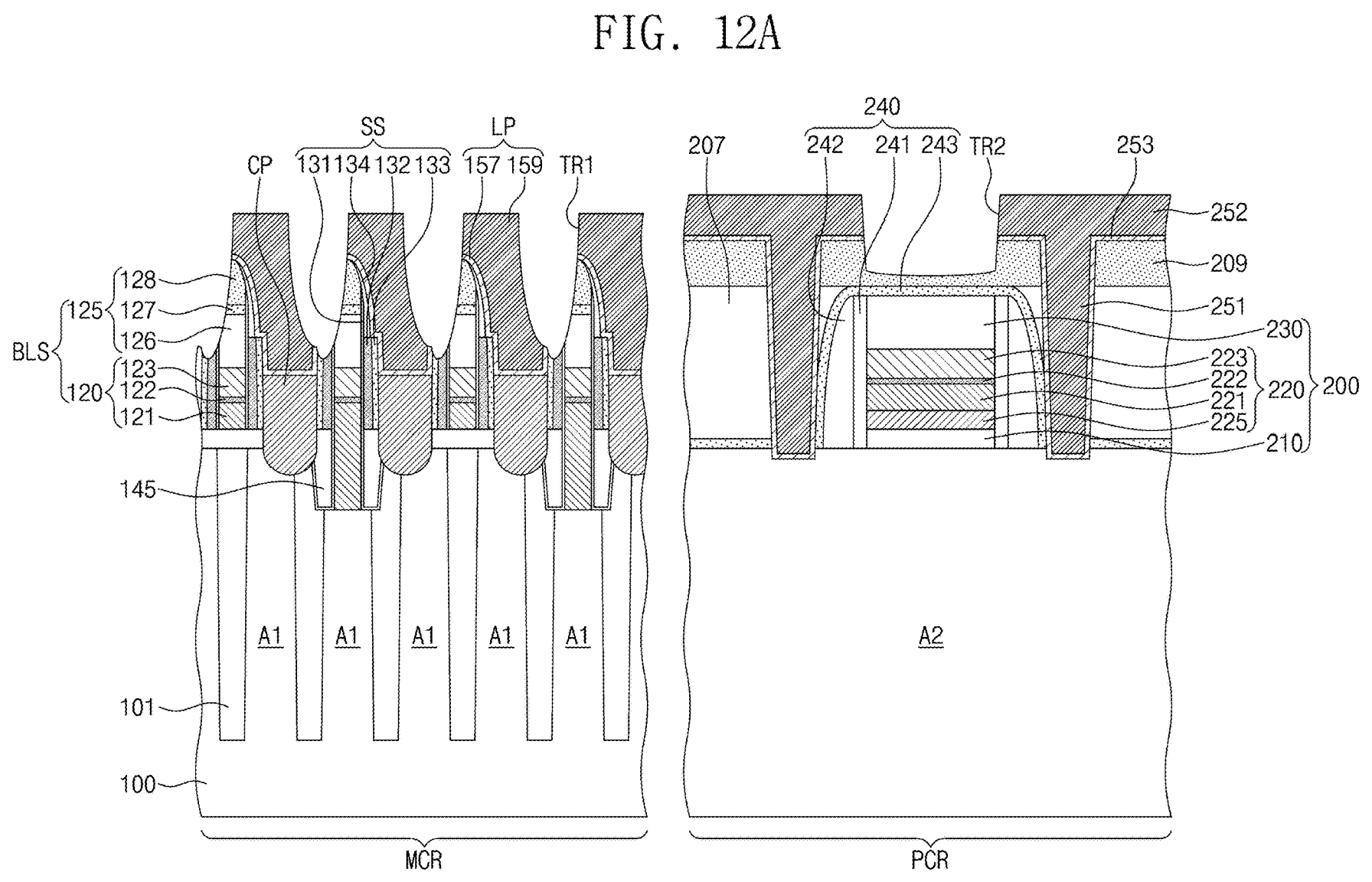

Referring to FIG. 12A, a patterning process may be performed on an entire top surface of the substrate 100 to form the first trench TR1 and the second trench TR2. The second trench TR2 may have a width greater than that of the first trench TR1.

Figure 12B:
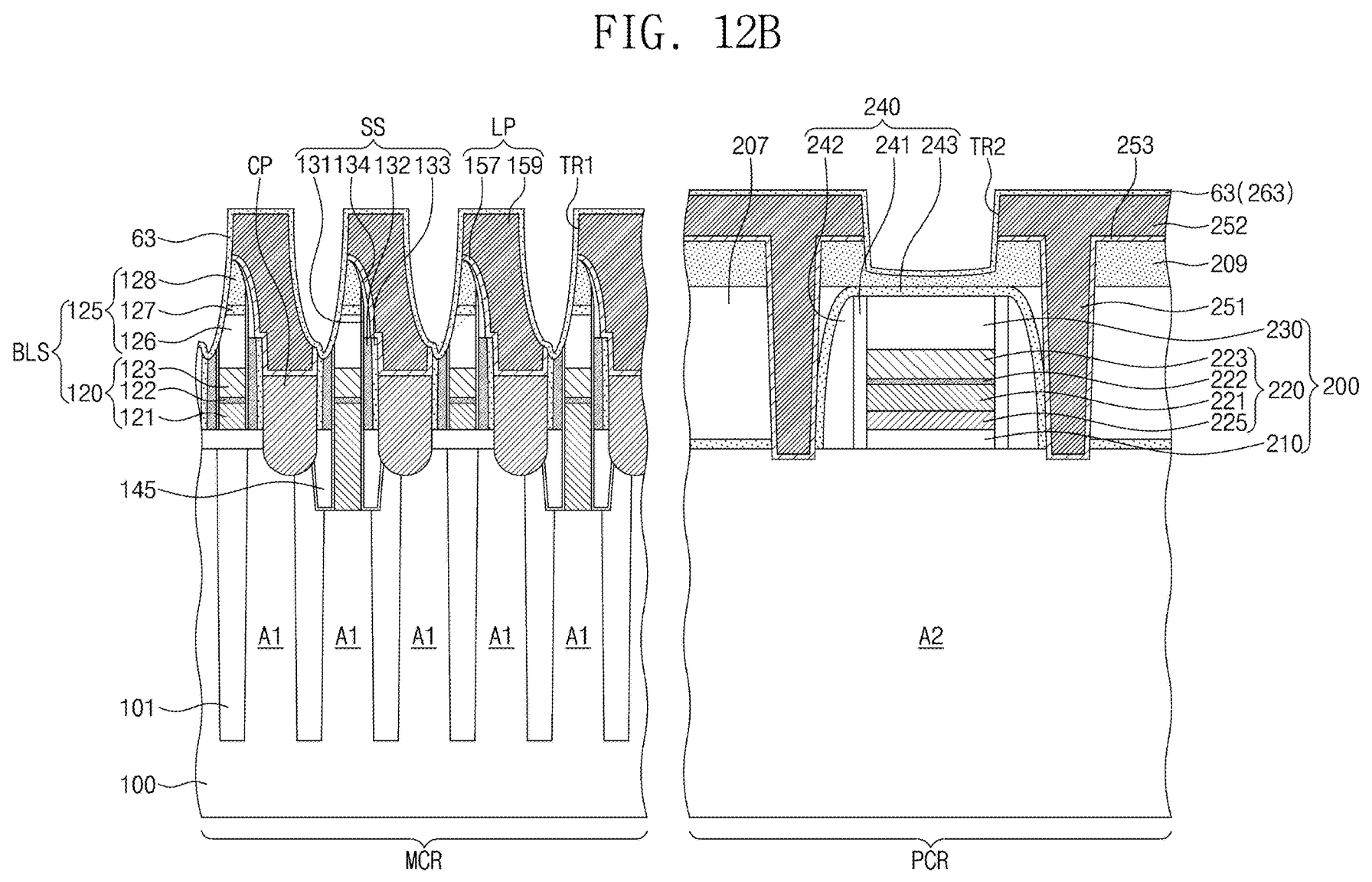

Referring to FIG. 12B, the preliminary interface layer 63 may be formed by performing the deposition process on an entire top surface of the substrate 100. On the cell region MCR, the preliminary interface layer 63 may be formed to conformally cover the top surfaces of the pad metal patterns 159 and the inner surface of the first trench TR1. On the peripheral region PCR, the preliminary interface layer 63 may be formed to conformally cover the top surfaces of the peripheral circuit wiring lines 252 and an inner surface of the second trench TR2. The preliminary interface layer 63 may form the wiring interface layer 263 on the peripheral region PCR.

Figure 12C:
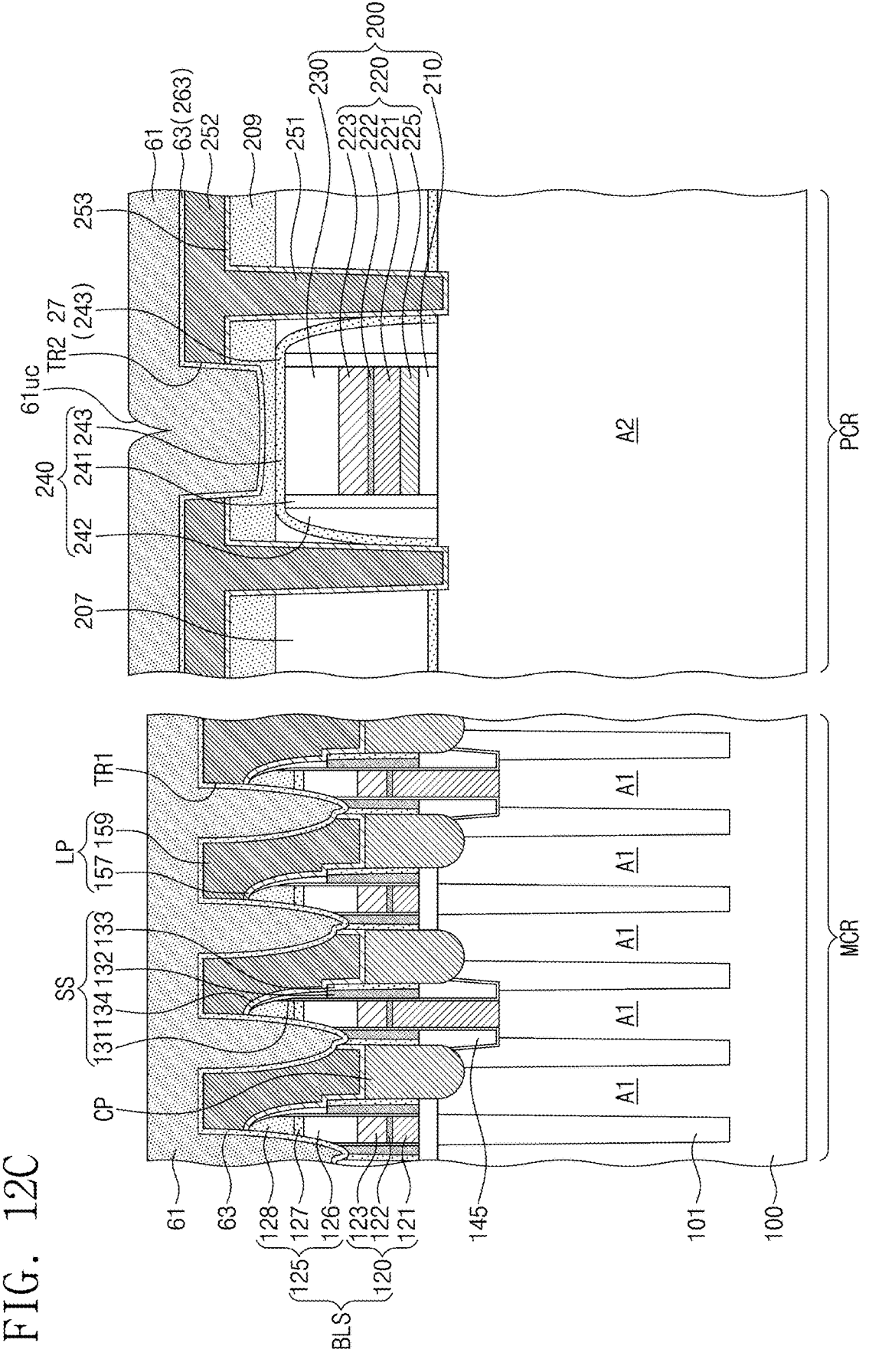

Referring to FIG. 12C, the first preliminary insulating pattern 61 may be formed by performing a deposition process on an entire top surface of the substrate 100. A recess 61$uc$ may be formed in a top surface of the first preliminary insulating pattern 61 of the peripheral region PCR by controlling a condition of the deposition process. The recess 61$uc$ may overlap with the second trench TR2.

Figure 12D:
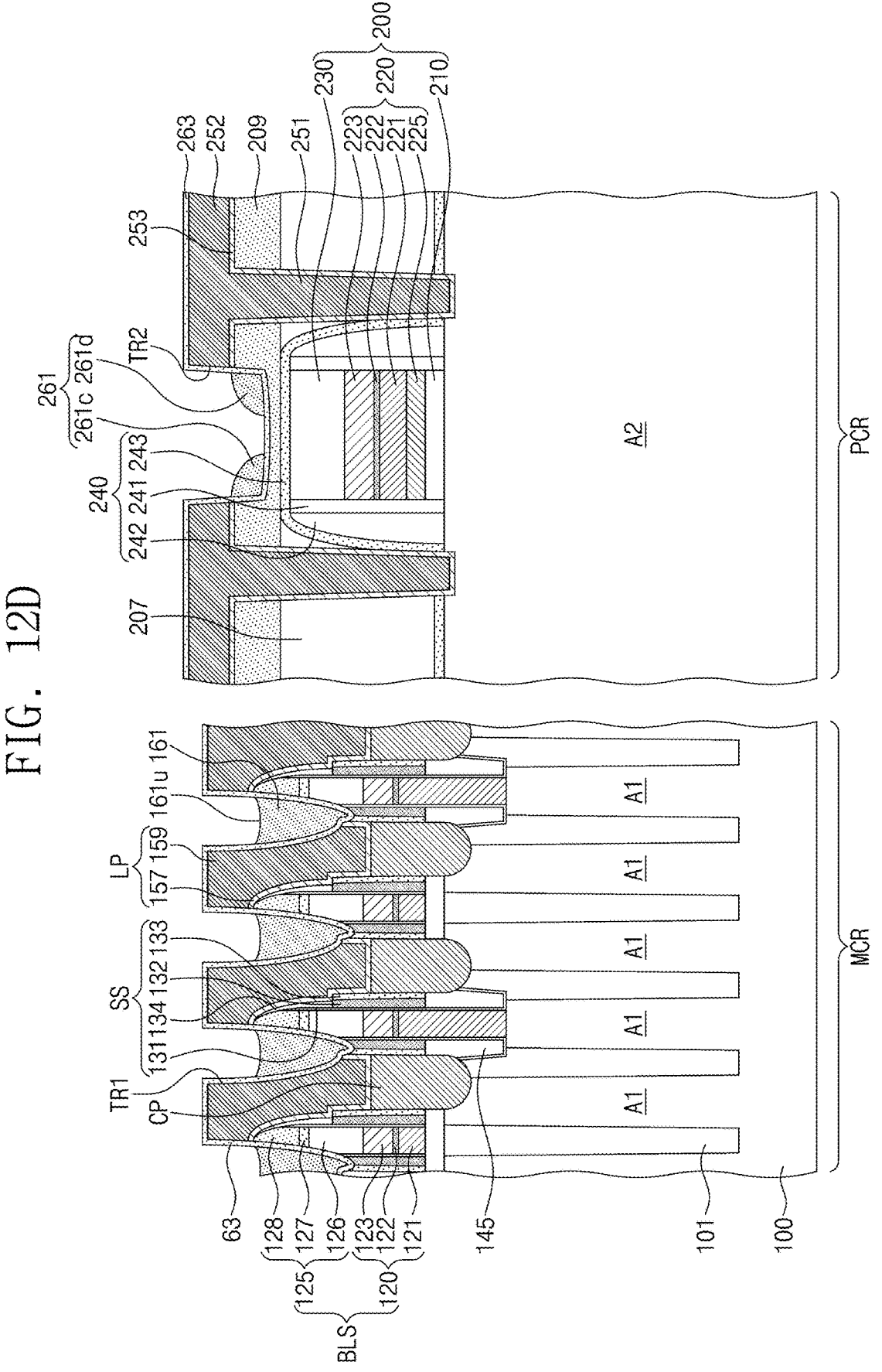

Referring to FIG. 12D, an etching process may be performed on the first preliminary insulating pattern 61 to form the first insulating pattern 161 and the first wiring insulating pattern 261. The first wiring insulating pattern 261 may include the first portion 261$c$ and the second portion 261$d$ which are spaced apart from each other in the second trench TR2. Each of the first and second portions 261$c$ and 261$d$ of the first wiring insulating pattern 261 may have a rounded surface and may have a width which decreases as a distance from a bottom surface of the second trench TR2 increases.

Figure 12E:
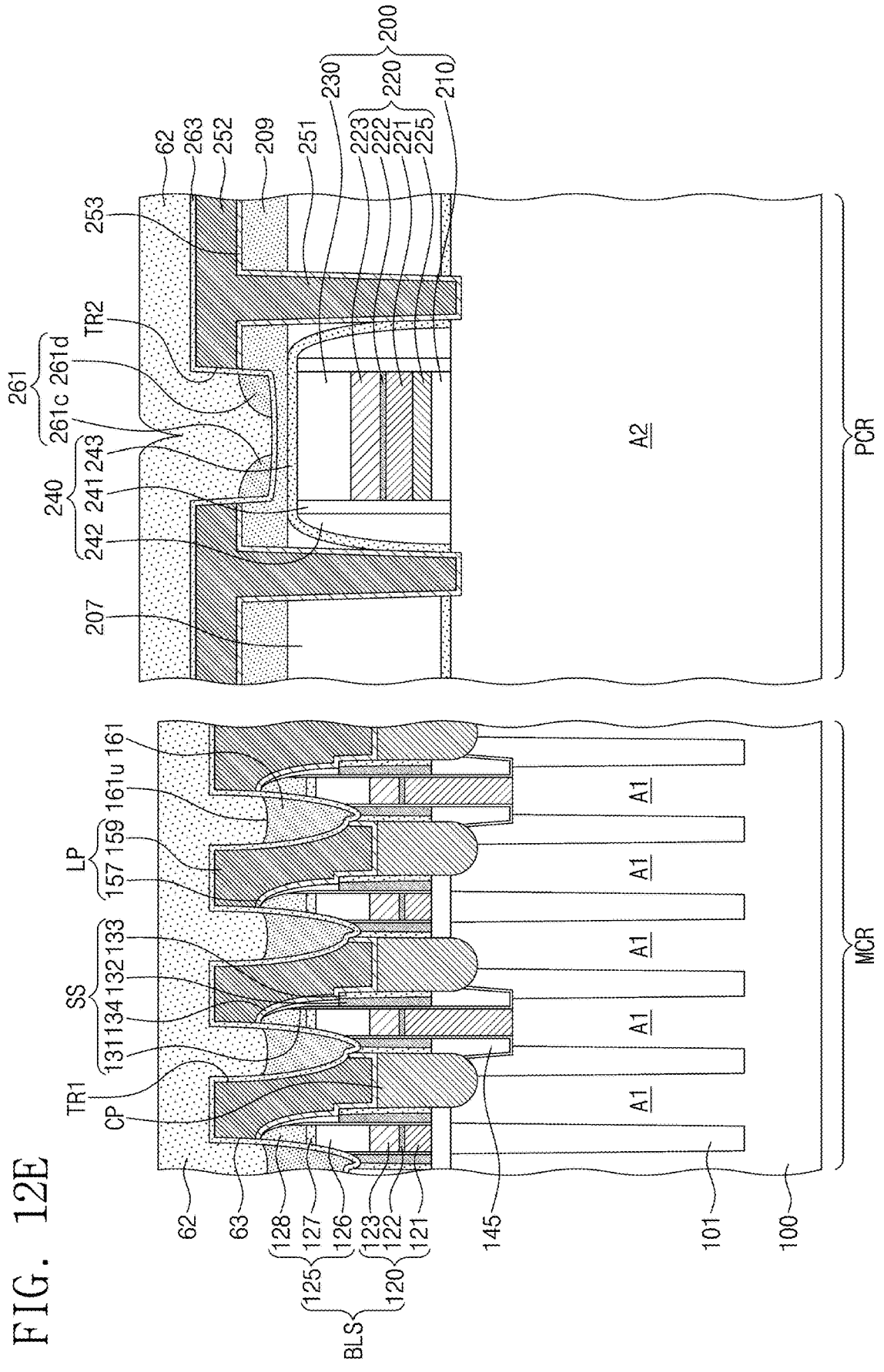

Referring to FIG. 12E, the second preliminary insulating pattern 62 may be formed. The second preliminary insulating pattern 62 may be formed using a deposition process. The second preliminary insulating pattern 62 may fill a remaining portion of the first trench TR1 on the cell region MCR. The second preliminary insulating pattern 62 of the peripheral region PCR may fill a space between the first portion 261$c$ and the second portion 261$d$ of the first wiring insulating pattern 261.

Figure 12F:
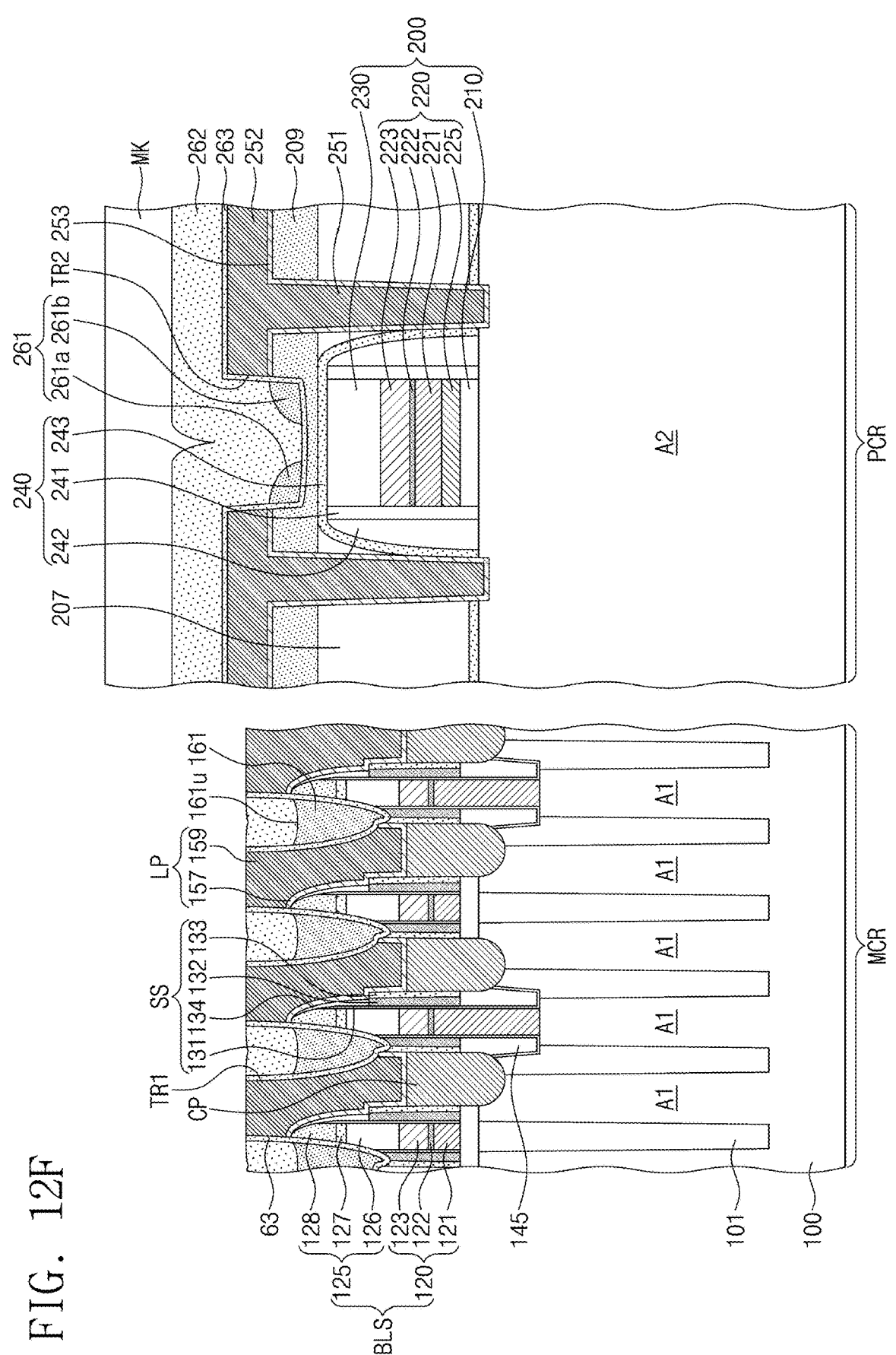

Referring to FIG. 12F, the second preliminary insulating pattern 62 on the cell region MCR may be partially removed. The partial removal of the second preliminary insulating pattern 62 may be performed using an etching process, and the peripheral region PCR may be covered by a cell open mask MK during the etching process. The cell open mask MK may be removed after the etching process. Next, as described with reference to FIGS. 3 and 6, the upper electrodes and the cell upper insulating layer may be formed on the cell region MCR, and the peripheral upper insulating layer may be formed on the peripheral region PCR.

By way of summation and review, a semiconductor device may include vertically stacked patterns, and contact plugs for electrically connecting the stacked patterns. As semiconductor devices have been highly integrated, distances between the patterns and/or distances between the contact plug and the patterns have been gradually reduced. Thus, a parasitic capacitance between the patterns and/or between the contact plug and the pattern may be increased. The parasitic capacitance may cause reduction of performance of a semiconductor device, e.g., reduction in operating speed of the semiconductor device.

In contrast, embodiments provide a semiconductor device with improved reliability and electrical characteristics. That is, according to embodiments, an insulating structure between landing pads may include an oxide layer (a H+ rich oxide having a high hydrogen concentration) and a nitride (SiN) layer that fill a space between the landing pads, such that the oxide layer is between the nitride layer and the substrate. Accordingly, hydrogen ions from the oxide layer may be supplied, e.g., diffused, to the substrate to reduce surface trap density, e.g., minimize dangling bonds on the surface of the substrate, thereby reducing leakage current and improving electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
bit lines extending in a first direction on a substrate;
a bit line capping pattern on one of two adjacent tones of the bit lines;
a lower contact connected to the substrate between two adjacent ones of the bit lines;
a landing pad on the lower contact; and
an insulating structure surrounding a sidewall of the landing pad, the insulating structure including:
a first insulating pattern having a top surface at a lower level than a top surface of the landing pad, and
a second insulating pattern on and contacting the top surface of the first insulating pattern,
wherein the top surface of the first insulating pattern has a concave shape toward the substrate,
wherein an edge portion of a top surface of the second insulating pattern is coplanar with the top surface of the landing pad,
wherein a central portion of the top surface of the second insulating pattern has a shape that is concave toward the substrate, and
wherein a lowest portion of the top surface of the first insulating pattern is at a lower level than an uppermost surface of the bit line capping pattern.

2. The semiconductor device as claimed in claim 1, wherein the first insulating pattern has a hydrogen concentration higher than that of the second insulating pattern.

3. The semiconductor device as claimed in claim 1, wherein the insulating structure further includes an interface layer between the sidewall of the landing pad and the first insulating pattern, the interface layer having an oxygen concentration lower than that of the first insulating pattern.

4. The semiconductor device as claimed in claim 1, wherein the first insulating pattern has a thickness greater than that of the second insulating pattern.

5. The semiconductor device as claimed in claim 1, further comprising:
an upper insulating layer on the top surface of the second insulating pattern,
wherein the upper insulating layer has a bottom end at a lower level than a center portion of the top surface of the landing pad.

6. The semiconductor device as claimed in claim 1, wherein the second insulating pattern has an oxygen concentration lower than that of the first insulating pattern.

7. The semiconductor device as claimed in claim 1, wherein a bottom end of the second insulating pattern is at a lower level than a top end of the bit line capping pattern.

8. The semiconductor device as claimed in claim 1, wherein a bottom end of the first insulating pattern is at a higher level than a bottom end of the bit line capping pattern.

9. The semiconductor device as claimed in claim 1, wherein the first insulating pattern has an air gap at a lower level than a bottom surface of the second insulating pattern.

10. The semiconductor device as claimed in claim 1, wherein the insulating structure further includes an interface layer between the sidewall of the landing pad and the first insulating pattern, and
wherein a top surface of the interface layer is substantially coplanar with the edge portion of the top surface of the second insulating pattern.

11. The semiconductor device as claimed in claim 1, wherein the first insulating pattern is hydrogen-enriched.

12. A semiconductor device, comprising:
a substrate including active regions and a device isolation layer defining the active regions;
word lines intersecting the active regions, the word lines extending in a first direction;
bit line structures on the word lines, the bit line structures extending in a second direction perpendicular to the first direction;
a bit line capping pattern on one of two adjacent ones of the bit line structures;
spacer structures on sidewalls of the bit line structures;
a lower contact between the spacer structures, the lower contact being connected to a corresponding one of the active regions;
a landing pad on the lower contact and extending onto a top surface of a corresponding one of the bit line structures, the landing pad including a pad metal pattern and a barrier layer between the pad metal pattern and the lower contact;
an insulating structure surrounding a sidewall of the landing pad, the insulating structure including:
a first insulating pattern, the first insulating pattern having a top surface at a lower level than a top surface of the landing pad,
a second insulating pattern on the first insulating pattern, and
an interface layer between the first insulating pattern and the sidewall of the landing pad;
an upper electrode on the top surface of the landing pad; and
an upper insulating layer on the second insulating pattern,
wherein the top surface of the first insulating patter has a concave shape toward the substrate,
wherein an edge portion of a top surface of the second insulating pattern is coplanar with the top surface of the landing pad,
wherein a central portion of the top surface of the second insulating pattern has a shape that is concave toward the substrate, and
wherein a lowest portion of the top surface of the first insulating pattern is at a lower level than an uppermost surface of the bit line capping pattern.

13. The semiconductor device as claimed in claim 12, wherein a bottom end of the first insulating pattern vertically overlaps with a spacer structure of the spacer structures.

14. The semiconductor device as claimed in claim 12, wherein the first insulating pattern has a hydrogen concentration higher than that of the second insulating pattern.

15. The semiconductor device as claimed in claim 12, wherein the first insulating pattern has a thickness greater than that of the second insulating pattern.

16. The semiconductor device as claimed in claim 12, wherein the first insulating pattern has an air gap at a lower level than a bottom surface of the second insulating pattern.

17. A semiconductor device, comprising:
a gate stack on a substrate, the gate stack including a gate electrode and a gate capping pattern on the gate electrode;

a gate spacer structure on a sidewall of the gate stack, the gate spacer structure including a gate spacer contacting a top surface of the gate capping pattern;

an interlayer insulating layer on a top surface of the gate stack and a top surface of the gate spacer structure;

peripheral circuit wiring lines on a top surface of the interlayer insulating layer;

a first wiring insulating pattern vertically overlapping with the gate electrode and filling a lower portion of a trench between the peripheral circuit wiring lines, a bottom end of the first wiring insulating pattern being at a lower level than the top surface of the interlayer insulating layer;

a second wiring insulating pattern extending from top surfaces of the peripheral circuit wiring lines into the trench; and a wiring interface layer between an inner surface of the trench and the first wiring insulating pattern, wherein the wiring interface layer contacts the first wiring insulating pattern, the gate capping pattern, and the gate spacer, and wherein a top surface of the first wiring insulating pattern is located at a lower level than the top surfaces of the peripheral circuit wiring lines.

18. The semiconductor device as claimed in claim 17, wherein the bottom end of the first wiring insulating pattern is at a lower level than a top surface of the gate capping pattern.

19. The semiconductor device as claimed in claim 17, wherein the first wiring insulating pattern has a hydrogen concentration higher than that of the second wiring insulating pattern.

\* \* \* \* \*